US010365548B2

(12) United States Patent
Holland et al.

(10) Patent No.: US 10,365,548 B2
(45) Date of Patent: *Jul. 30, 2019

(54) SYSTEMS, DEVICES, AND METHODS FOR FOCUSING LASER PROJECTORS

(71) Applicant: THALMIC LABS INC., Kitchener (CA)

(72) Inventors: Lloyd Frederick Holland, Kitchener (CA); Vance R. Morrison, Kitchener (CA)

(73) Assignee: North Inc., Kitchener, ON (CA)

( * ) Notice: Subject to any disclaimer, the term of this patent is extended or adjusted under 35 U.S.C. 154(b) by 128 days.

This patent is subject to a terminal disclaimer.

(21) Appl. No.: 15/487,232

(22) Filed: Apr. 13, 2017

(65) Prior Publication Data
US 2017/0299956 A1    Oct. 19, 2017

Related U.S. Application Data

(60) Provisional application No. 62/322,128, filed on Apr. 13, 2016.

(51) Int. Cl.
*G03B 21/20* (2006.01)
*G02B 26/10* (2006.01)
(Continued)

(52) U.S. Cl.
CPC ......... *G03B 21/2033* (2013.01); *G02B 26/10* (2013.01); *G02B 27/0172* (2013.01);
(Continued)

(58) Field of Classification Search
CPC .... G02B 2027/0181; G02B 2027/0183; G02B 27/0103; G02B 2001/043;
(Continued)

(56) References Cited

U.S. PATENT DOCUMENTS 3,408,133 A    10/1968    Lee
3,712,716 A    1/1973    Cornsweet et al.
(Continued)

FOREIGN PATENT DOCUMENTS

JP    61-198892 A    9/1986
JP    10-319240 A    12/1998
(Continued)

OTHER PUBLICATIONS

International Search Report and Written Opinion, dated Dec. 8, 2016, for International Application No. PCT/US2016/050225, 15 pages.

(Continued)

*Primary Examiner* — Jennifer D. Carruth
(74) *Attorney, Agent, or Firm* — Thomas Mahon

(57) ABSTRACT

Systems, devices, and methods for focusing laser projectors are described. A laser projector includes N≥1 laser diodes, each of which emits laser light having a divergence. Each laser diode is paired with a respective primary or collimation lens to at least reduce a divergence of the laser light that the laser diode produces. Downstream from the primary lens(es) in the optical path(s) of the laser light, a single dedicated secondary or convergence lens converges the laser light to a focus. By initiating the convergence of the laser light at the secondary or convergence lens as opposed to at the primary or collimation lens(es), numerous benefits that are particularly advantageous in laser projection-based wearable heads-up displays are realized.

12 Claims, 6 Drawing Sheets

(51) Int. Cl.
| | |
|---|---|
| *G02B 27/01* | (2006.01) |
| *G02B 27/14* | (2006.01) |
| *G02B 27/30* | (2006.01) |
| *G02C 11/00* | (2006.01) |
| *H01S 5/00* | (2006.01) |
| *H01S 5/40* | (2006.01) |
| *H01S 5/02* | (2006.01) |
| *G03B 21/62* | (2014.01) |
| *H01S 5/022* | (2006.01) |

(52) U.S. Cl.
CPC ............ *G02B 27/14* (2013.01); *G02B 27/30* (2013.01); *G02C 11/10* (2013.01); *G03B 21/62* (2013.01); *H01S 5/0071* (2013.01); *H01S 5/02* (2013.01); *H01S 5/4012* (2013.01); *H01S 5/4087* (2013.01); *G02B 2027/0174* (2013.01); *G02B 2027/0178* (2013.01); *H01S 5/005* (2013.01); *H01S 5/02212* (2013.01); *H01S 5/4093* (2013.01)

(58) Field of Classification Search
CPC .... G02B 2027/0105; G02B 2027/0107; G02B 2027/0109; G02B 2027/011; G02B 2027/0112; G02B 2027/0114; G02B 2027/0116; G02B 2027/0118; G02B 2027/012; G02B 2027/0123; G02B 2027/0125; G02B 2027/0127; G02B 2027/0129; G02B 2027/013; G02B 2027/0132; G02B 2027/0134; G02B 2027/0136; G02B 2027/0174; G02B 2027/0178; G02B 27/01; G02B 27/0101; G02B 27/0172; G02B 27/017; G02B 2027/015; G02B 2027/0152; G02B 27/0176; G02B 2027/014; G02B 5/32; G02B 27/0189; G02B 23/00; G02B 21/20; G02B 27/30; G02B 27/14; G02B 26/10; G03H 2001/043; G03H 2240/25; G03H 2270/21; G03H 2222/20; G03H 2222/33; G03H 2222/40; G03B 21/20; G03B 21/2033; G02C 11/00; G02C 11/10; H01S 5/00; H01S 5/40; H01S 5/0071; H01S 5/4087; H01S 5/02; H01S 5/4012; H01S 5/4093; H01S 5/005; H01S 5/02212

See application file for complete search history.

(56) References Cited

U.S. PATENT DOCUMENTS

| | | |
|---|---|---|
| 4,978,213 A | 12/1990 | El Hage |
| 5,103,323 A | 4/1992 | Magarinos et al. |
| 5,231,674 A | 7/1993 | Cleveland et al. |
| 5,467,104 A | 11/1995 | Furness, III et al. |
| 5,589,956 A | 12/1996 | Morishima et al. |
| 5,596,339 A | 1/1997 | Furness, III et al. |
| 5,742,421 A | 4/1998 | Wells et al. |
| 6,008,781 A | 12/1999 | Furness, III et al. |
| 6,027,216 A | 2/2000 | Guyton et al. |
| 6,184,847 B1 | 2/2001 | Fateh et al. |
| 6,204,829 B1 | 3/2001 | Tidwell |
| 6,236,476 B1 | 5/2001 | Son et al. |
| 6,317,103 B1 | 11/2001 | Furness, III et al. |
| 6,353,503 B1 | 3/2002 | Spitzer et al. |
| 6,377,277 B1 | 4/2002 | Yamamoto |
| 6,639,570 B2 | 10/2003 | Furness, III et al. |
| 6,972,734 B1 | 12/2005 | Ohshima et al. |
| 7,473,888 B2 | 1/2009 | Wine et al. |
| 7,640,007 B2 | 12/2009 | Chen et al. |
| 7,684,105 B2 | 3/2010 | Lamontagne et al. |
| 7,747,113 B2 | 6/2010 | Mukawa et al. |
| 7,773,111 B2 | 8/2010 | Cleveland et al. |
| 7,850,306 B2 | 12/2010 | Uusitalo et al. |
| 7,925,100 B2 | 4/2011 | Howell et al. |
| 7,927,522 B2 | 4/2011 | Hsu |
| 8,120,828 B2 | 2/2012 | Schwerdtner |
| 8,179,604 B1 | 5/2012 | Prada Gomez et al. |
| 8,188,937 B1 | 5/2012 | Amafuji et al. |
| 8,355,671 B2 | 1/2013 | Kramer et al. |
| 8,560,976 B1 | 10/2013 | Kim |
| 8,634,119 B2 | 1/2014 | Bablumyan et al. |
| 8,666,212 B1 | 3/2014 | Amirparviz |
| 8,704,882 B2 | 4/2014 | Turner |
| 8,922,481 B1 | 12/2014 | Kauffmann et al. |
| 8,922,898 B2 | 12/2014 | Legerton et al. |
| 8,970,571 B1 | 3/2015 | Wong et al. |
| 8,971,023 B2 | 3/2015 | Olsson et al. |
| 9,086,687 B2 | 7/2015 | Park et al. |
| 9,135,708 B2 | 9/2015 | Ebisawa |
| 9,477,079 B2 | 10/2016 | Bailey et al. |
| 2001/0033402 A1 | 10/2001 | Popovich |
| 2002/0003627 A1 | 1/2002 | Rieder |
| 2002/0007118 A1 | 1/2002 | Adachi et al. |
| 2002/0030636 A1 | 3/2002 | Richards |
| 2002/0093701 A1 | 7/2002 | Zhang et al. |
| 2002/0120916 A1 | 8/2002 | Snider, Jr. |
| 2004/0174287 A1 | 9/2004 | Deak |
| 2005/0012715 A1 | 1/2005 | Ford |
| 2006/0238707 A1 | 10/2006 | Elvesjo et al. |
| 2007/0078308 A1 | 4/2007 | Daly |
| 2007/0132785 A1 | 6/2007 | Ebersole, Jr. et al. |
| 2009/0109241 A1 | 4/2009 | Tsujimoto |
| 2009/0179824 A1 | 7/2009 | Tsujimoto et al. |
| 2009/0207464 A1 | 8/2009 | Wiltshire et al. |
| 2009/0258669 A1 | 10/2009 | Nie et al. |
| 2009/0322653 A1 | 12/2009 | Putilin et al. |
| 2010/0053555 A1 | 3/2010 | Enriquez et al. |
| 2010/0060551 A1 | 3/2010 | Sugiyama et al. |
| 2010/0142015 A1 | 6/2010 | Kuwahara et al. |
| 2010/0149073 A1 | 6/2010 | Chaum et al. |
| 2010/0150415 A1 | 6/2010 | Atkinson et al. |
| 2010/0239776 A1 | 9/2010 | Yajima et al. |
| 2012/0002256 A1 | 1/2012 | Lacoste et al. |
| 2012/0139817 A1 | 6/2012 | Freeman |
| 2012/0169752 A1 | 7/2012 | Kurozuka |
| 2012/0182309 A1 | 7/2012 | Griffin et al. |
| 2012/0188158 A1 | 7/2012 | Tan et al. |
| 2012/0249797 A1 | 10/2012 | Haddick et al. |
| 2012/0290401 A1 | 11/2012 | Neven |
| 2012/0302289 A1 | 11/2012 | Kang |
| 2013/0009853 A1 | 1/2013 | Hesselink et al. |
| 2013/0016292 A1 | 1/2013 | Miao et al. |
| 2013/0016413 A1 | 1/2013 | Saeedi et al. |
| 2013/0088413 A1 | 4/2013 | Raffle et al. |
| 2013/0135722 A1 | 5/2013 | Yokoyama |
| 2013/0165813 A1 | 6/2013 | Chang et al. |
| 2013/0169560 A1 | 7/2013 | Cederlund et al. |
| 2013/0198694 A1 | 8/2013 | Rahman et al. |
| 2013/0215235 A1 | 8/2013 | Russell |
| 2013/0222384 A1 | 8/2013 | Futterer |
| 2013/0265437 A1 | 10/2013 | Thörn et al. |
| 2013/0285901 A1 | 10/2013 | Lee et al. |
| 2013/0300652 A1 | 11/2013 | Raffle et al. |
| 2013/0332196 A1 | 12/2013 | Pinsker |
| 2013/0335302 A1 | 12/2013 | Crane et al. |
| 2014/0045547 A1 | 2/2014 | Singamsetty et al. |
| 2014/0125760 A1 | 5/2014 | Au et al. |
| 2014/0198034 A1 | 7/2014 | Bailey et al. |
| 2014/0198035 A1 | 7/2014 | Bailey et al. |
| 2014/0202643 A1 | 7/2014 | Hikmet et al. |
| 2014/0204455 A1 | 7/2014 | Popovich et al. |
| 2014/0204465 A1 | 7/2014 | Yamaguchi |
| 2014/0226193 A1 | 8/2014 | Sun |
| 2014/0232651 A1 | 8/2014 | Kress et al. |
| 2014/0285429 A1 | 9/2014 | Simmons |
| 2014/0368896 A1 | 12/2014 | Nakazono et al. |
| 2015/0036221 A1 | 2/2015 | Stephenson |
| 2015/0156716 A1 | 6/2015 | Raffle et al. |
| 2015/0205126 A1 | 7/2015 | Schowengerdt |

(56) References Cited

U.S. PATENT DOCUMENTS

| | | | |
|---|---|---|---|
| 2015/0205134 A1 | 7/2015 | Bailey et al. | |
| 2015/0268821 A1 | 9/2015 | Ramsby et al. | |
| 2015/0279114 A1* | 10/2015 | Yonekubo | G02B 6/0031 345/633 |
| 2015/0325202 A1 | 11/2015 | Lake et al. | |
| 2015/0362734 A1 | 12/2015 | Moser et al. | |
| 2015/0378161 A1 | 12/2015 | Bailey et al. | |
| 2015/0378162 A1 | 12/2015 | Bailey et al. | |
| 2016/0033771 A1 | 2/2016 | Tremblay et al. | |
| 2016/0202081 A1 | 7/2016 | Debieuvre et al. | |
| 2016/0238845 A1 | 8/2016 | Alexander et al. | |
| 2016/0274365 A1 | 9/2016 | Bailey et al. | |
| 2016/0274758 A1 | 9/2016 | Bailey | |
| 2016/0327796 A1 | 11/2016 | Bailey et al. | |
| 2016/0327797 A1 | 11/2016 | Bailey et al. | |
| 2016/0349514 A1 | 12/2016 | Alexander et al. | |
| 2016/0349515 A1 | 12/2016 | Alexander et al. | |
| 2016/0349516 A1 | 12/2016 | Alexander et al. | |
| 2016/0377865 A1 | 12/2016 | Alexander et al. | |
| 2016/0377866 A1 | 12/2016 | Alexander et al. | |
| 2017/0068095 A1 | 3/2017 | Holland et al. | |
| 2017/0097753 A1 | 4/2017 | Bailey et al. | |
| 2017/0115483 A1 | 4/2017 | Aleem et al. | |
| 2017/0153701 A1 | 6/2017 | Mahon et al. | |
| 2017/0205876 A1 | 7/2017 | Vidal et al. | |
| 2017/0212290 A1 | 7/2017 | Alexander et al. | |
| 2017/0212349 A1 | 7/2017 | Bailey et al. | |
| 2017/0219829 A1 | 8/2017 | Bailey | |
| 2017/0343796 A1 | 11/2017 | Bailey et al. | |
| 2017/0343797 A1 | 11/2017 | Bailey et al. | |
| 2018/0007255 A1 | 1/2018 | Tang | |
| 2018/0107102 A1* | 4/2018 | Holland | G03B 21/62 |
| 2018/0107103 A1* | 4/2018 | Holland | G03B 21/62 |

FOREIGN PATENT DOCUMENTS

| | | |
|---|---|---|
| JP | 2013-127489 A | 6/2013 |
| JP | 2013-160905 A | 8/2013 |
| KR | 10-2004-0006609 A | 1/2004 |
| WO | 2014/155288 A2 | 10/2014 |
| WO | 2015-123775 A1 | 8/2015 |

OTHER PUBLICATIONS

International Search Report and Written Opinion, dated Jan. 18, 2017, for International Application No. PCT/US2016/054852, 12 pages.

International Search Report and Written Opinion, dated Oct. 13, 2017, for International Application No. PCT/US2017/040323, 16 pages.

International Search Report and Written Opinion, dated Sep. 28, 2017, for International Application No. PCT/US2017/027479, 13 pages.

Janssen, "Radio Frequency (RF)" 2013, retrieved from https://web.archive.org/web/20130726153946/https://www.techopedia.com/definition/5083/radio-frequency-rf, retrieved on Jul. 12, 2017, 2 pages.

Merriam-Webster, "Radio Frequencies" retrieved from https://www.merriam-webster.com/table/collegiate/radiofre.htm, retrieved on Jul. 12, 2017, 2 pages.

Amitai, "P-27: A Two-Dimensional Aperture Expander for Ultra-Compact, High-Performance Head-Worn Displays," *SID Symposium Digest of Technical Papers* 36(1):360-363, 2005.

Äyräs et al., "Exit pupil expander with a large field of view based on diffractive optics," *Journal of the SID* 17(8):659-664, 2009.

Chellappan et al., "Laser-based displays: a review," *Applied Optics* 49(25):F79-F98, 2010.

Cui et al., "Diffraction from angular multiplexing slanted volume hologram gratings," *Optik* 116:118-122, 2005.

Curatu et al., "Dual Purpose Lens for an Eye-Tracked Projection Head-Mounted Display," International Optical Design Conference 2006, *SPIE-OSA* 6342:63420X-1-63420X-7, 2007.

Curatu et al., "Projection-based head-mounted display with eye-tracking capabilities," *Proc. of SPIE* 5875:58750J-1-58750J-9, 2005.

Essex, "Tutorial on Optomechanical Beam Steering Mechanisms," OPTI 521 Tutorial, College of Optical Sciences, University of Arizona, 8 pages, 2006.

Fernéndez et al., "Optimization of a thick polyvinyl alcohol-acrylamide photopolymer for data storage using a combination of angular and peristrophic holographic multiplexing," *Applied Optics* 45(29):7661-7666, 2009.

Hainich et al., "Chapter 10: Near-Eye Displays," *Displays: Fundamentals & Applications*, AK Peters/CRC Press, 2011, 65 pages.

Hornstein et al., "Maradin's Micro-Mirror—System Level Synchronization Notes," SID 2012 Digest, pp. 981-984.

International Search Report and Written Opinion dated Apr. 25, 2017 for corresponding International Application No. PCT/US2016/067246, 12 pages.

International Search Report, dated Jun. 8, 2016, for PCT/US2016/018293, 17 pages.

International Search Report, dated Jun. 8, 2016, for PCT/US2016/018298, 14 pages.

International Search Report, dated Jun. 8, 2016, for PCT/US2016/018299, 12 pages.

Itoh et al., "Interaction-Free Calibration for Optical See-Through Head-Mounted Displays based on 3D Eye Localization," 2014 IEEE Symposium on 3D User Interfaces (3DUI), pp. 75-82, 2014.

Kessler, "Optics of Near to Eye Displays (NEDs)," Presentation—Oasis 2013, Tel Aviv, Feb. 19, 2013, 37 pages.

Kress et al., "Diffractive and Holographic Optics as Optical Combiners in Head Mounted Displays," Proceedings of the 2013 ACM Conference on Pervasive and Ubiquitous Computing Adjunct Publication, pp. 1479-1482, 2013.

Kress et al., "A review of head-mounted displays (HMD) technologies and applications for consumer electronics," Proc. of SPIE 8720:87200A-1-87200A-13, 2013.

Kress, "Optical architectures for see-through wearable displays," Presentation—Bay Area—SID Seminar, Apr. 30, 2014, 156 pages.

Levola, "7.1: Invited Paper: Novel Diffractive Optical Components for Near to Eye Displays," *SID Symposium Digest of Technical Papers* 37(1):64-67, 2006.

Liao et al., "The Evolution of MEMS Displays," *IEEE Transactions on Industrial Electronics* 56(4): 1057-1065, 2009.

Lippert, "Chapter 6: Display Devices: RSD™ (Retinal Scanning Display)," *The Avionics Handbook*, CRC Press, 2001, 8 pages.

Majaranta et al., "Chapter 3—Eye-Tracking and Eye-Based Human-Computer Interaction," in *Advances in Physiological Computing*, Springer-Verlag London, 2014, pp. 17-39.

Schowengerdt et al., "Stereoscopic retinal scanning laser display with integrated focus cues for ocular accommodation" *Proc. of SPIE—IS& T Electronic Imaging* 5291:366-376, 2004.

Silverman et al., "58.5L: Late-News Paper: Engineering a Retinal Scanning Laser Display with Integrated Accommodative Depth Cues," SID 03 Digest, pp. 1538-1541, 2003.

Takatsuka et al., "Retinal projection display using diffractive optical element," Tenth International Conference on Intelligent Information Hiding and Multimedia Signal Processing, IEEE, 2014, pp. 403-406.

Urey et al., "Optical performance requirements for MEMS-scanner based microdisplays," Conf. on MOEMS and Miniaturized Systems, *SPIE* 4178:176-185, 2000.

Urey, "Diffractive exit-pupil expander for display applications," *Applied Optics* 40(32):5840-5851, 2001.

Viirre et al., "The Virtual Retinal Display: A New Technology for Virtual Reality and Augmented Vision in Medicine," *Proc. of Medicine Meets Virtual Reality*, IOS Press and Ohmsha, 1998, pp. 252-257. (6 pages).

\* cited by examiner

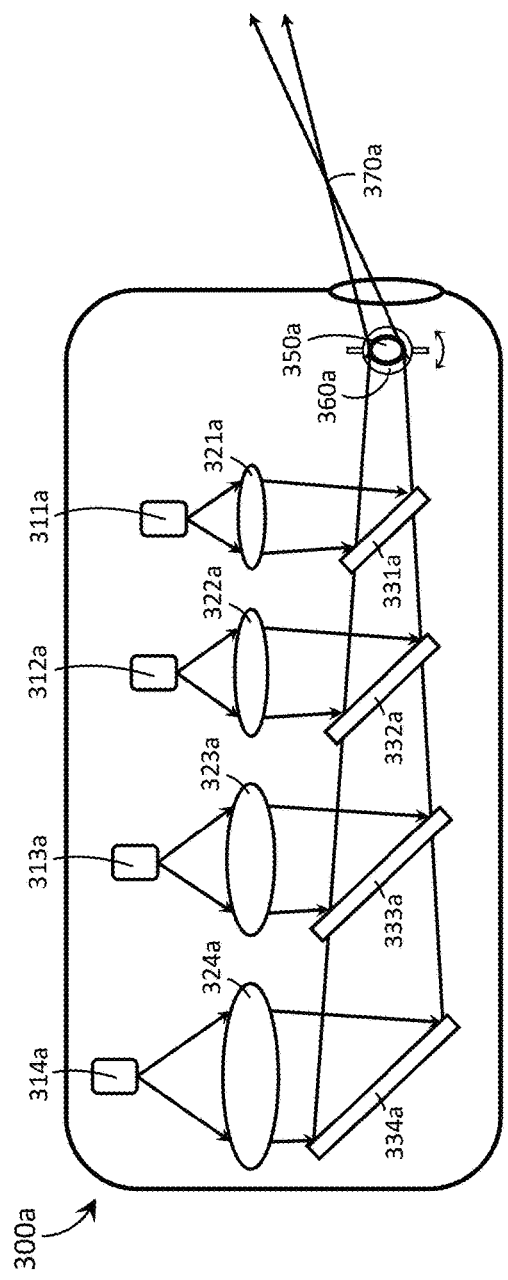
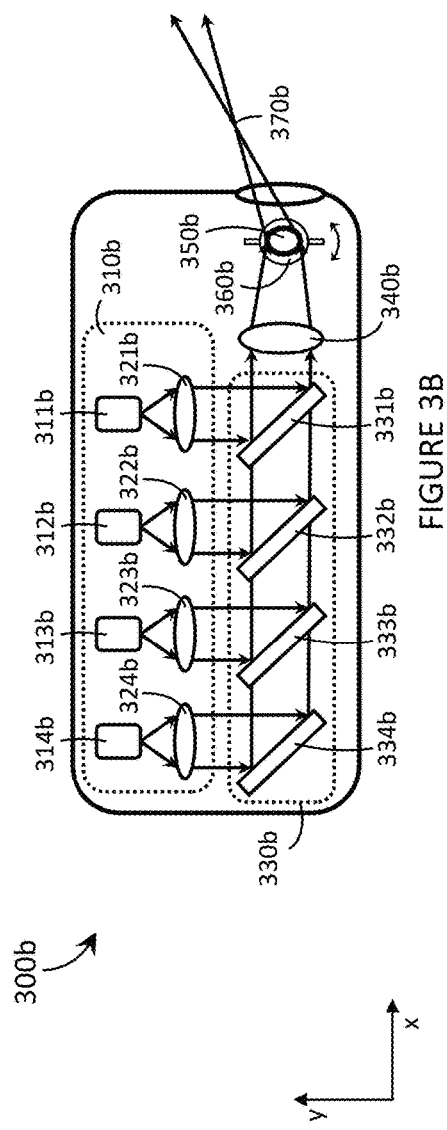
FIGURE 3A
FIGURE 3B

SYSTEMS, DEVICES, AND METHODS FOR FOCUSING LASER PROJECTORS

TECHNICAL FIELD

The present systems, devices, and methods generally relate to laser projectors and particularly relate to focusing the laser light output by laser projectors.

BACKGROUND

Description of the Related Art

Laser Projectors

A projector is an optical device that projects or shines a pattern of light onto another object (e.g., onto a surface of another object, such as onto a projection screen) in order to display an image or video on that other object. A projector necessarily includes a light source, and a laser projector is a projector for which the light source comprises at least one laser. The at least one laser is temporally modulated to provide a pattern of laser light and usually at least one controllable mirror is used to spatially distribute the modulated pattern of laser light over a two-dimensional area of another object. The spatial distribution of the modulated pattern of laser light produces an image at or on the other object. In conventional laser projectors, the at least one controllable mirror may include: a single digital micromirror (e.g., a microelectromechanical system ("MEMS") based digital micromirror) that is controllably rotatable or deformable in two dimensions, or two digital micromirrors that are each controllably rotatable or deformable about a respective dimension, or a digital light processing ("DLP") chip comprising an array of digital micromirrors.

Wearable Heads-Up Displays

A head-mounted display is an electronic device that is worn on a user's head and, when so worn, secures at least one electronic display within a viewable field of at least one of the user's eyes, regardless of the position or orientation of the user's head. A wearable heads-up display is a head-mounted display that enables the user to see displayed content but also does not prevent the user from being able to see their external environment. The "display" component of a wearable heads-up display is either transparent or at a periphery of the user's field of view so that it does not completely block the user from being able to see their external environment. Examples of wearable heads-up displays include: the Google Glass®, the Optinvent Ora®, the Epson Moverio®, and the Sony Glasstron®, just to name a few.

The optical performance of a wearable heads-up display is an important factor in its design. When it comes to face-worn devices, however, users also care a lot about aesthetics. This is clearly highlighted by the immensity of the eyeglass (including sunglass) frame industry. Independent of their performance limitations, many of the aforementioned examples of wearable heads-up displays have struggled to find traction in consumer markets because, at least in part, they lack fashion appeal. Most wearable heads-up displays presented to date employ large display components and, as a result, most wearable heads-up displays presented to date are considerably bulkier and less stylish than conventional eyeglass frames.

A challenge in the design of wearable heads-up displays is to minimize the bulk of the face-worn apparatus will still providing displayed content with sufficient visual quality. There is a need in the art for wearable heads-up displays of more aesthetically-appealing design that are capable of providing high-quality images to the user without limiting the user's ability to see their external environment.

BRIEF SUMMARY

A laser projector may be summarized as including: a laser module to provide laser light, the laser module comprising: a first laser diode to provide a first laser light, wherein the laser light provided by the laser module includes at least the first laser light; and a first collimation lens positioned in an optical path of the first laser light, the first collimation lens oriented to receive the first laser light and at least reduce a divergence of the first laser light; and a convergence lens positioned downstream from the laser module in an optical path of the laser light, the convergence lens oriented to receive the laser light from the laser module and converge the laser light to a focus outside of the projector. The focus of the laser light may have a non-zero beam waist.

The laser projector may further include: a first scan mirror positioned in the optical path of the laser light in between the convergence lens and the focus of the laser light, wherein a spot size of the laser light at the first scan mirror is greater than a spot size of the laser light at the focus of the laser light, and wherein the first scan mirror includes a two dimensional reflective area and the spot size of the laser light at the first scan mirror is less than or equal to the reflective area of the first scan mirror. The reflective area of the first scan mirror may be controllably rotatable about a first axis and a dimension of the spot size of the laser light at the reflective area of the first scan mirror may be less than or equal to a dimension of the reflective area of the first scan mirror along the first axis. The laser projector may further include: a second scan mirror positioned in the optical path of the laser light in between the first scan mirror and the focus of the laser light, wherein: the second scan mirror includes a two dimensional reflective area; the reflective area of the second scan mirror is controllably rotatable about a second axis that is orthogonal to the first axis of the reflective area of the first scan mirror; and a dimension of the spot size of the laser light at the reflective area of the second scan mirror is less than or equal to a dimension of the reflective area of the second scan mirror along the second axis.

The laser module may further include: a second laser diode to provide a second laser light, wherein the laser light provided by the laser module includes the second laser light; and a second collimation lens positioned in an optical path of the second laser light, the second collimation lens to receive the second laser light and at least reduce a divergence of the second laser light. A wavelength of the first laser light may be different from a wavelength of the second laser light. The laser module may further include: at least a third laser diode to provide at least a third laser light, wherein the laser light provided by the laser module includes the at least a third laser light; and at least a third collimation lens positioned in an optical path of the at least a third laser light, the at least a third collimation lens to receive the at least a third laser light and at least reduce a divergence of the at least a third laser light. The laser projector may further include a combiner positioned and oriented to receive the first laser light and the second laser light and to combine the first laser light and the second laser light into the laser light.

A wavelength of the first laser light may be different from a wavelength of the second laser light, and the combiner may include: a first mirror formed of a material that is reflective of the first laser light, the first mirror positioned in the optical path of the first laser light and oriented to redirect the first laser light towards the convergence lens; and a second mirror formed of a dichroic material that is reflective of the first laser light and transmissive of the second laser light, the second mirror positioned in the optical path of the first laser light in between the first mirror and the convergence lens, and the second mirror also positioned in the optical path of the second laser light and oriented to: redirect the second laser light towards the convergence lens, and combine the optical path of the second laser light with the optical path of the first laser light for a portion of the optical path of the first laser light that is downstream from the second mirror.

A wearable heads-up display may be summarized as including: a support structure that in use is worn on a head of a user; a holographic combiner carried by the support structure, wherein the holographic combiner is positioned within a field of view of an eye of the user when the support structure is worn on the head of the user; and a laser projector carried by the support structure and positioned and oriented to direct laser light towards the holographic combiner, wherein the laser projector comprises: at least one laser diode to provide laser light; at least one collimation lens positioned in an optical path of the laser light, the at least one collimation lens oriented to receive the laser light and at least reduce a divergence of the laser light; and a convergence lens positioned downstream from the at least one collimation lens in the optical path of the laser light, the convergence lens oriented to receive the laser light having at least reduced divergence from the at least one collimation lens and converge the laser light to a focus in between the laser projector and the holographic combiner.

The laser projector may further include at least one scan mirror positioned in the optical path of the laser light in between the convergence lens and the focus of the laser light, wherein a spot size of the laser light at the at least one scan mirror may be greater than a spot size of the laser light at the focus of the laser light. A spot size of the laser light at the holographic combiner may be greater than a spot size of the laser light at the focus of the laser light, and the holographic combiner may include at least one hologram to at least approximately collimate the laser light and redirect the at least approximately collimated laser light towards the eye of the user.

A laser projector may be summarized as including: a set of N laser diodes, where N≥1, each laser diode in the set of N laser diodes to provide a respective laser light having a divergence; a set of N primary lenses, each primary lens in the set of N primary lenses positioned and oriented to receive a respective laser light from a respective one of the N laser diodes and each primary lens in the set of N primary lenses positioned and oriented to at least reduce the divergence of a respective laser light from a respective one of the N laser diodes; a combiner positioned and oriented to receive each respective laser light having at least reduced divergence from each respective one of the N primary lenses and combine each respective laser light having at least reduced divergence from each respective one of the N primary lenses into an aggregate laser light; and a secondary lens positioned and oriented to receive the aggregate laser light from the combiner and converge the aggregate laser light to a focus outside of the laser projector. The focus of the aggregate laser light may have a non-zero beam waist.

The laser projector may further include: a first scan mirror positioned and oriented to receive the aggregate laser light from the secondary lens, wherein a spot size of the aggregate laser light at the first scan mirror is greater than a spot size of the aggregate laser light at the focus of the aggregate laser light, and wherein the first scan mirror includes a two dimensional reflective area and the spot size of the aggregate laser light at the first scan mirror is less than or equal to the reflective area of the first scan mirror. The reflective area of the first scan mirror may be controllably rotatable about a first axis and a dimension of the spot size of the aggregate laser light at the reflective area of the first scan mirror may be less than or equal to a dimension of the reflective area of the first scan mirror along the first axis. The laser projector may further include: a second scan mirror positioned and oriented to receive the aggregate laser light from the first scan mirror, wherein: the second scan mirror includes a two dimensional reflective area; the reflective area of the second scan mirror is controllably rotatable about a second axis that is orthogonal to the first axis of the reflective area of the first scan mirror; and a dimension of the spot size of the aggregate laser light at the reflective area of the second scan mirror is less than or equal to a dimension of the reflective area of the second scan mirror along the second axis.

The set of N laser diodes may include a first laser diode to provide laser light of a first wavelength and at least a second laser diode to provide laser light of at least a second wavelength.

A method of focusing a laser light provided by a laser projector, wherein the laser projector includes a laser module having at least one laser diode, may be summarized as including: providing the laser light by the laser module of the laser projector, wherein the laser light has a divergence; at least reducing the divergence of the laser light by at least one collimation lens; and converging the laser light to a focus by a convergence lens positioned downstream from the at least one collimation lens in an optical path of the laser light, wherein the focus is positioned outside of the laser projector.

The laser module of the laser projector may include N laser diodes, where N≥1, and providing the laser light by the laser module of the laser projector may include providing a respective laser light by each respective one of the N laser diodes, each respective laser light having a divergence. The at least one collimation lens may include N collimation lenses and at least reducing the divergence of the laser light by at least one collimation lens may include at least reducing the divergence of each respective laser light by a respective one of N collimation lenses.

Converging the laser light to a focus by a convergence lens may include converging the laser light to a focus having a non-zero beam waist by the convergence lens. At least reducing the divergence of the laser light by at least one collimation lens may include collimating the laser light by at least one collimation lens.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

FIG. 3A is an illustrative diagram of an exemplary laser projector that adopts an elongated form factor but employs the conventional approach of a dedicated focusing lens for each respective laser diode.

FIG. 3B is an illustrative diagram of an exemplary laser projector that adopts an elongated form factor and employs a single dedicated convergence lens to focus the laser light in accordance with the present systems, devices, and methods.

DETAILED DESCRIPTION

Figure 1:
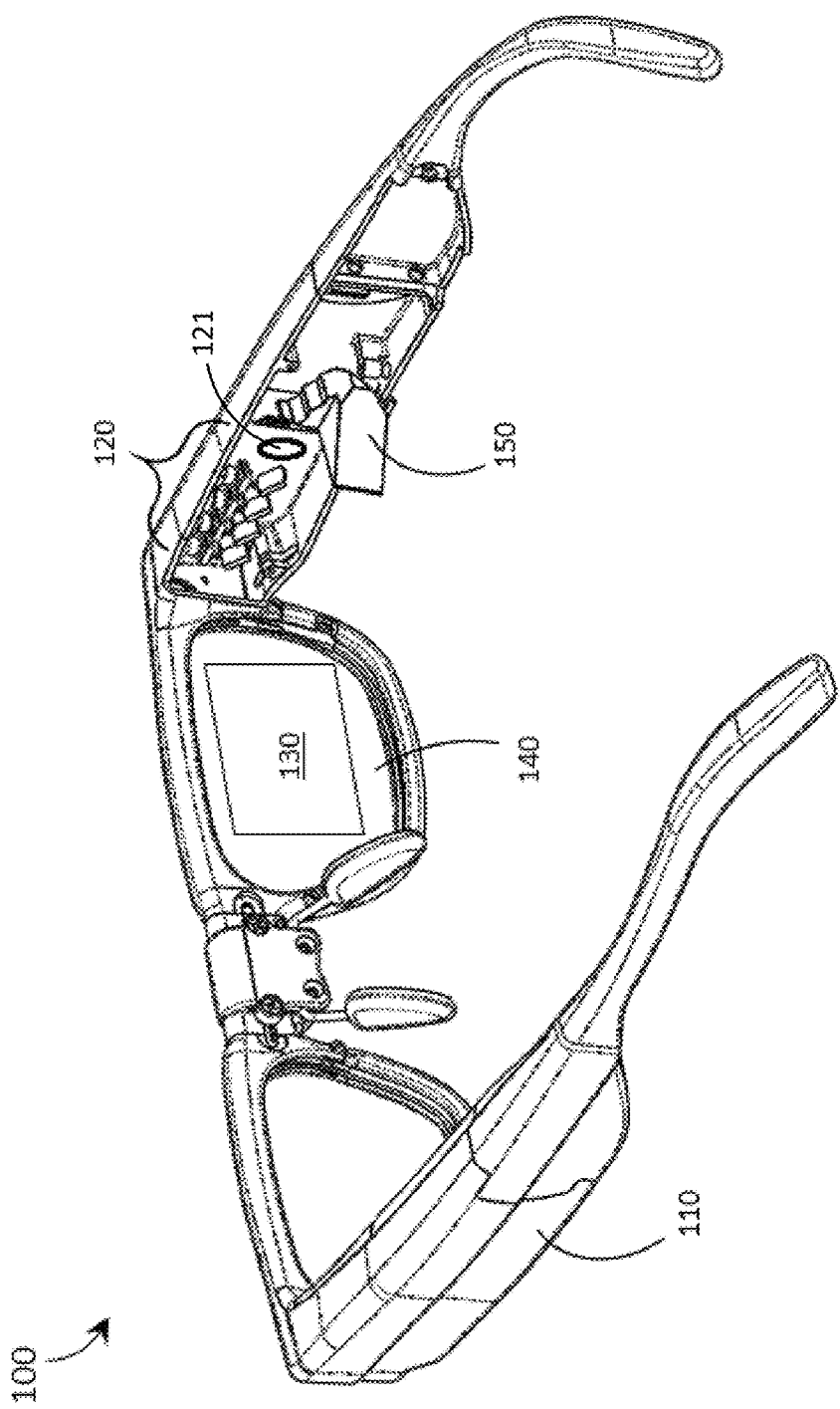
FIG. 1 is a partial-cutaway perspective view of a wearable heads-up display that includes a laser projector with a compact form factor in accordance with the present systems, devices, and methods.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electronic devices and head-worn devices, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the embodiments.

The "spot size" of a laser beam refers to the cross sectional area of the laser beam at any point along the length of the beam. It is generally desirable for the laser beam in a laser projector to impinge on the at least one controllable mirror with a spot size that is less than or equal to the area of the controllable mirror itself (or the total area of the array of mirrors in the case of a DLP). If the spot size of the laser beam at the at least one controllable mirror is larger than the area of the mirror itself then portions of the laser "spot" that extend over the perimeter of the mirror may not be redirected by the mirror and may be cropped from the optical path of the projector. In this way, the area of the at least one controllable mirror effectively serves as an aperture in the optical path of the laser light—only laser light that impinges on the mirror follows the projection path to become a deliberate part of the projected image. Unwanted cropping of the laser beam at the at least one controllable mirror is inefficient and can adversely affect the quality of the projected image by, for example, reducing the brightness, intensity, and/or color saturation of the projected image relative to what can be achieved if the entire laser spot fits on the area of the at least one controllable mirror.

The at least one controllable mirror in a laser projector is typically quite small. For example, a laser projector that implements two MEMS-based scan mirrors that are each controllably rotatable (or deformable) about a respective axis may employ mirrors each having a reflective area of a few $mm^2$ or less (e.g., less than 5 $mm^2$ and sometimes less than 1 $mm^2$). Part of why such mirrors are so small is because they need to actuate (e.g., rotate or deform) very quickly (e.g., at a rate on the order of Hz to kHz) and it is generally desirable for such actuation to be effected using as little power as possible. For a given electrical power, a large MEMS mirror will generally actuate more slowly than a smaller MEMS mirror, and for a given rate of actuation, a large MEMS mirror will generally consume more power than a smaller MEMS mirror; thus, when a high rate of actuation and low power consumption are both desired (as is generally the case in laser projectors), a small mirror size can be advantageous.

The at least one controllable mirror effectively serves as an aperture in the laser projector, and the small size of the mirror generally introduces a small aperture in the optical path of the laser light. As described above, it is advantageous to ensure that the spot size of the laser light is less than or equal to the size of the at least one controllable mirror when the laser light impinges thereon so that none of the laser light is lost due to cropping; however, most laser diodes emit highly-diverging laser light (e.g., up to around 30 degrees divergence in at least one direction) that, without any adjustment, would cause the spot size of the laser beam to exceed the size of a typical controllable mirror within a much shorter distance than the distance which typically separates the laser diode from the at least one controllable mirror. In order to accommodate this divergence without cropping the laser light, a focusing lens is usually positioned near the laser diode to receive the diverging laser light and converge it to a spot on the at least one controllable mirror with a spot size that is less than or equal to the size of the mirror itself.

In a conventional laser projector comprising a RGB laser module with a red laser diode, a green laser diode, and a blue laser diode, each respective laser diode has a corresponding respective focusing lens. The relative positions of the laser diodes, the focusing lenses, and the at least one controllable mirror are all tuned and aligned so that each laser beam impinges on the at least one controllable mirror with substantially the same spot size and with substantially the same rate of convergence (so that all laser beams will continue to have substantially the same spot size as they propagate away from the laser projector towards, e.g., a projection screen). In a conventional laser projector, it is usually possible to come up with such a configuration for all these elements because the overall form factor of the device is not a primary design consideration. However, in applications for which the form factor of the laser projector is an important design element, it can be very challenging to find a configuration for the laser diodes, the focusing lenses, and the at least one controllable mirror that sufficiently aligns the laser beams (at least in terms of spot size, spot position, and rate of convergence) while satisfying the form factor constraints.

The various embodiments described herein provide systems, devices, and methods for focusing the laser light output by a laser projector and are particularly well-suited for use in applications for which the overall form factor of the laser projector is an important design constraint. An example of such an application is in scanning laser-based wearable heads-up displays ("WHUDs").

Generally, a scanning laser-based WHUD is a form of virtual retinal display in which a scanning laser projector ("SLP") draws a raster scan onto the eye of the user. The SLP may project laser light directly onto/into the eye of the user or laser light from the SLP may be routed towards the eye of the user by one or more optical element(s) in the optical path of the laser light en route from the SLP to the eye of the user. Exemplary architectures for SLP-based WHUDs that may be used in conjunction with (e.g., that may benefit from implementing) the present systems, devices, and methods include without limitation the WHUD architecture(s) described in: US Patent Application Publication No. US 2015-0378161 A1, U.S. Non-Provisional patent application Ser. No. 15/046,234, U.S. Non-Provisional patent application Ser. No. 15/046,254, U.S. Non-Provisional patent application Ser. No. 15/046,269, U.S. Provisional Patent Application Ser. No. 62/156,736, U.S. Non-Provisional patent application Ser. No. 15/145,576, US Patent Application Publication No. US 2016-0327797 A1, and/or U.S. Patent Application Publication No. US 2016-0327796 A1.

FIG. 1 is a partial-cutaway perspective view of a WHUD 100 that includes a laser projector (i.e., a SLP) 120 with a compact form factor in accordance with the present systems, devices, and methods. WHUD 100 comprises a support structure 110 that in use is worn on the head of a user and has a general shape and appearance of an eyeglasses (e.g., sunglasses) frame. Support structure 110 carries multiple components, including: SLP 120, a holographic combiner 130 carried at, on, or in a lens 140, and an exit pupil expansion optic 150. Portions of SLP 120 and exit pupil expansion optic 150 may be contained within an inner volume of support structure 110; however, FIG. 1 provides a partial-cutaway view in which regions of support structure 110 have been removed in order to render visible portions of SLP 120 and exit pupil expansion optic 150 that may otherwise be concealed.

Throughout this specification and the appended claims, the term "carries" and variants such as "carried by" are generally used to refer to a physical coupling between two objects. The physical coupling may be direct physical coupling (i.e., with direct physical contact between the two objects) or indirect physical coupling that may be mediated by one or more additional objects. Thus, the term carries and variants such as "carried by" are meant to generally encompass all manner of direct and indirect physical coupling, including without limitation: carried on, carried within, physically coupled to, and/or supported by, with or without any number of intermediary physical objects therebetween.

SLP 120 may include multiple laser diodes (e.g., a red laser diode, a green laser diode, and/or a blue laser diode) and at least one scan mirror (e.g., a single two-dimensional scan mirror or two one-dimensional scan mirrors, which may be, e.g., MEMS-based or piezo-based). SLP 120 may be communicatively coupled to (and support structure 110 may further carry) a processor and a non-transitory processor-readable storage medium or memory storing processor-executable data and/or instructions that, when executed by the processor, cause the processor to control the operation of SLP 120. For ease of illustration, FIG. 1 does not call out a processor or a memory.

Holographic combiner 130 is positioned within a field of view of at least one eye of the user when support structure 110 is worn on the head of the user. Holographic combiner 130 is sufficiently optically transparent to permit light from the user's environment (i.e., "environmental light") to pass through to the user's eye. In the illustrated example of FIG. 1, support structure 110 further carries a transparent eyeglass lens 140 (e.g., a prescription eyeglass lens) and holographic combiner 130 comprises at least one layer of holographic material that is adhered to, affixed to, laminated with, carried in or upon, or otherwise integrated with eyeglass lens 140. The at least one layer of holographic material may include a photopolymer film such as Bayfol® HX available from Bayer MaterialScience AG or a silver halide compound and may, for example, be integrated with transparent lens 140 using any of the techniques described in U.S. Provisional Patent Application Ser. No. 62/214,600 and/or US Patent Application Publication No. US 2017-0068095 A1. Holographic combiner 130 includes at least one hologram in or on the at least one layer of holographic material. With holographic combiner 130 positioned in a field of view of an eye of the user when support structure 110 is worn on the head of the user, the at least one hologram of holographic combiner 130 is positioned and oriented to redirect light originating from SLP 120 towards the eye of the user. In particular, the at least one hologram is positioned and oriented to receive light signals that originate from SLP 120 and converge those light signals to at least one exit pupil at or proximate the eye of the user.

Exit pupil expansion optic 150 is positioned in an optical path between projector 120 and holographic combiner 130 and may take on any of a variety of different forms, including without limitation those described in U.S. patent application Ser. No. 15/046,234, U.S. patent application Ser. No. 15/046,254, and/or U.S. patent application Ser. No. 15/046,269.

SLP 120 has a form factor that is specifically designed to fit within the limited space afforded by support structure 110. In this configuration, aligned focusing (both in terms of spot size and rate of convergence) of the laser beams provided by each of the laser diodes in SLP 120 is a particular engineering challenge. In accordance with the present systems, devices, and methods, SLP 120 includes a single dedicated focusing lens, or "convergence lens," 121 that is positioned in the optical paths of the laser light provided by all of the laser diodes in SLP 120. Convergence lens 121 is oriented to receive a respective laser light from each laser diode in SLP 120 and to converge each respective laser light to a focus (e.g., a common focus) that may be located in between SLP 120 and holographic combiner 130. In some implementations, convergence lens 121 applies substantially the same "focusing profile" or "convergence profile" to each of the laser beams generated by the laser diodes in SLP 120 so that the laser beams align in terms of spot size and rate of convergence.

WHUD 100 is an illustrative example of a scanning laser-based WHUD with approximately the form factor of a typical pair of eyeglasses or sunglasses. However, the display architecture employing SLP 120 and holographic combiner 130 in WHUD 100 is capable of enabling even smaller, more compact WHUD form factors.

Figure 2A:
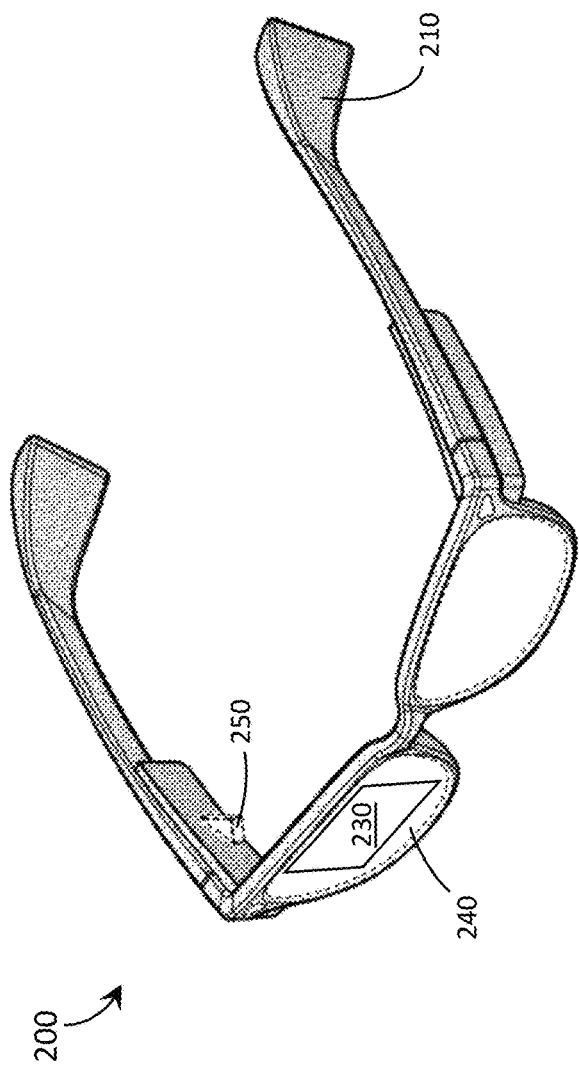
FIG. 2A is a perspective view of a wearable heads-up display with a form factor that substantially matches that of a conventional pair of eyeglasses or sunglasses enabled by the present systems, devices, and methods.

FIG. 2A is a perspective view of a WHUD 200 with a form factor that substantially matches that of a conventional pair of eyeglasses or sunglasses enabled by the present systems, devices, and methods. WHUD 200 is substantially similar to WHUD 100 from FIG. 1 in that WHUD 200 comprises all of the same components as those described for WHUD 100, including a support structure 210, an SLP (not visible in FIG. 2A), a holographic combiner 230, an eyeglass lens 240, and an exit pupil expansion optic 250; however, at least some of the components of WHUD 200 have been adapted (e.g., further miniaturized) relative to their counterparts in WHUD 100 to enable WHUD 200 to have a smaller, more compact form factor compared to WHUD 100. As will be described in more detail later on, the inclusion of a dedicated convergence lens (e.g., convergence lens 121 from FIG. 1) is a contributing factor in achieving a compact form factor for the SLP in WHUD 200 in accordance with the present systems, devices and methods.

Figure 2B:
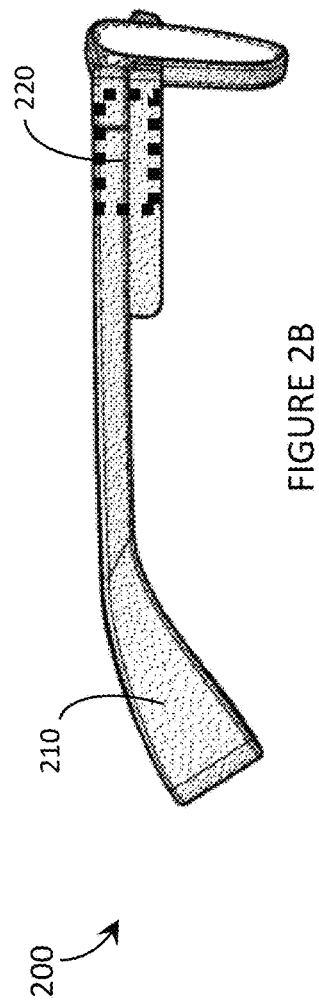
FIG. 2B is a side elevation view of the wearable heads-up display from FIG. 2A calling out the region in which the laser projector is located.

FIG. 2B is a side elevation view of WHUD 200 from FIG. 2A calling out the region 220 (represented by a dashed rectangle) of WHUD 200 in which the SLP is located. The SLP of WHUD 200 is not visible in FIGS. 2A and 2B because the SLP of WHUD 200 is contained within the support structure 210 of WHUD 200 and neither FIG. 2A nor FIG. 2B provides a cut-away view to expose the inner volume of support structure 210. However, the region 220 of support structure 210 in which the SLP of WHUD 200 is located is substantially similar to the region of support structure 110 in which SLP 110 of WHUD 100 is located.

The support structure of a conventional pair of eyeglasses or sunglasses typically includes elongated arms that extend from the lenses of the glasses (e.g., either by coupling to the lenses directly or by coupling to a "rims" portion of the support structure that at least partially encompasses the lenses) on either side of the user's head and rest on top of the user's ears. These elongated arms are less conspicuous than the lens and/or rims portions of the frames and may advantageously be adapted to carry more functional components in a WHUD that adopts the conventional glasses form factor. By adding functional components to the arms as opposed to the rims, a conventional glasses frame may be adapted to function as a WHUD while substantially maintaining the conventional glasses form factor. Such is the design approach in WHUD 200 depicted in FIGS. 2A and 2B.

In order to add functional components to the arms of a conventional glasses frame while minimizing the overall impact of the functional components on the form factor of the glasses frame, the functional components themselves may advantageously adopt an elongated form factor that substantially matches, aligns with, or fits with the elongated form factor of the arms. To this end, region 220 of WHUD 200 that includes the SLP of WHUD 200 is an elongated, rectangular region having a length that stretches in parallel with the arms of support structure 210 of WHUD 200. It follows that the SLP itself in WHUD 200 may advantageously adopt a compact elongated form factor in order to fit within region 220.

A conventional laser projector may include multiple laser diodes and, as previously described, each laser diode is typically paired with a respective focusing lens. This is because each laser diode typically emits diverging laser light that needs to be focused and directed towards at least one scan mirror, and because a conventional laser projector is not designed to optimize the form factor for compact elongated geometries.

Throughout this specification and the appended claims, references to "diverging laser light" and "laser light having a divergence" refer to a laser beam that is increasing in diameter at the point in question. A person of skill in the art will appreciate that a laser light that is diverging at a point B in its optical path may be converging at a point A that is upstream from the point B in the optical path. In this case (and in the absence of any optical devices such as lenses, etc.), a beam waist will typically occur at a point in the optical path in between point A and point B, where at the beam waist the laser light changes from converging (i.e., having a convergence) to diverging (i.e., having a divergence). Thus, in some implementations, a laser diode that provides diverging laser light (or laser light having a divergence) may provide laser light that initially converges (i.e., has a convergence) to a beam waist within or in close proximity to (e.g., within a distance on the order of micrometers or millimeters) the laser diode and then has a diverging optical path downstream from the beam waist.

FIG. 3A is an illustrative diagram of an exemplary laser projector 300a that adopts an elongated form factor but employs the conventional approach of a dedicated focusing lens for each respective laser diode. Laser projector 300a includes four laser diodes 311a, 312a, 313a, and 314a each operative to emit a diverging laser light having a respective wavelength. For example, laser diode 311a may emit diverging red laser light, laser diode 312a may emit diverging green laser light, laser diode 313a may emit diverging blue laser light, and laser diode 314a may emit diverging infrared laser light. Laser light is represented in FIG. 3A by pairs of solid arrows, where the area including and in between each pair of solid arrows corresponds to a respective laser beam. The red, green, and blue laser light may be used to project a visible image while the infrared laser light may be used for eye tracking purposes, for example, as described in U.S. Provisional Patent Application Ser. No. 62/167,767, U.S. Provisional Patent Application Ser. No. 62/271,135, US Patent Application Publication No. US 2016-0349514 A1, U.S. Provisional Patent Application Ser. No. 62/245,792, and/or U.S. patent application Ser. No. 15/331,204.

Laser projector 300a includes a set of focusing lenses 321a, 322a, 323a, and 324a. Each of focusing lenses 321a, 322a, 323a, and 324a is paired with a respective one of laser diodes 311a, 312a, 313a, and 314a. Specifically, focusing lens 321a is positioned and oriented to receive diverging red laser light from red laser diode 311a and converge the red laser light to a focus 370a, focusing lens 322a is positioned and oriented to receive diverging green laser light from green laser diode 312a and converge green laser light to focus 370a, focusing lens 323a is positioned and oriented to receive diverging blue laser light from blue laser diode 313a and converge blue laser light to focus 370a, and focusing lens 324a is positioned and oriented to receive diverging infrared laser light from infrared laser diode 314a and converge infrared laser light to focus 370a. Laser projector 300a also includes a combiner comprising four reflectors 331a, 332a, 333a, and 334a each positioned and oriented to reflect at least one laser light and at least three of which (specifically, reflectors 331a, 332a, and 333a) are transmissive of at least one other laser light. Specifically, reflector 331a may be formed of a dichroic material that is reflective of red laser light emitted by red laser diode 311a and transmissive of the other laser light (i.e., green laser light, blue laser light, and infrared laser light) emitted by the other laser diodes (i.e., laser diodes 312a, 313a, and 314a, respectively); reflector 332a may be formed dichroic material that is reflective of green laser light emitted by green laser diode 312a and transmissive of the blue laser light emitted by blue laser diode 313a and infrared laser light emitted by infrared laser diode 314a; reflector 333a may be formed of a dichroic material that is reflective of blue laser light emitted by blue laser diode 313a and transmissive of infrared laser light emitted by infrared laser diode 314a; and reflector 334a may be reflective of at least infrared laser light emitted by infrared laser diode 314a. In the configuration illustrated in FIG. 3A, reflectors 331a, 332a, 333a, and 334a are arranged to combine the red laser light from red laser diode 311a, the green laser light from green laser diode 312a, the blue laser light from blue laser diode 313a, and the infrared laser light from infrared laser diode 314a all into a single laser beam (an "aggregate laser beam") that is output by laser projector 300a. Focusing lenses 321a, 322a, 323a, and 324a cause each different laser light (i.e., each of the different color components) in the aggregate laser beam to converge with substantially the same rate of convergence to achieve substantially the same spot size 350a at the at least one scan mirror 360a in laser projector 300a.

As previously described, it can be advantageous for focusing lenses 321a, 322a 323a, and 324 to align each laser light (i.e., the red laser light emitted by red laser diode 311a, the green laser light emitted by green laser diode 312a, the blue laser light emitted by blue laser diode 313a, and the infrared laser light emitted by infrared laser diode 314a) so that all laser light has substantially the same rate of convergence and spot size at any given point along the length of the optical path of the aggregate laser beam, because such can help to ensure that each of the color components of the aggregate laser beam focuses and combines (e.g., to produce an intended color) in a controlled and deliberate way over the entire projection area. If the various rays or beams of laser light did not all have substantially the same spot size and rate of convergence at any given point along the optical path of the aggregate laser beam, then at different regions of the projection area the relative spot sizes of the various color components may not align in a consistent way and the overall quality of the projected image(s) may suffer.

The elongated rectangular form factor of laser projector 300a may be designed to accommodate the form factor constraints of a specific application such as, for example, the elongated form factor of region 220 on WHUD 200 where projector 300a may be carried by support structure 210 for use in WHUD 200. This elongated form factor can cause the various laser diodes 311a, 312a, 313a, and 314a in laser projector 300a to be positioned at different distances from scan mirror 360a. In the illustrated implementation, red laser light from red laser diode 311a travels a first distance $X_1$ (i.e., along a first optical path) to reach scan mirror 360a, green laser light from green laser diode 312a travels a second distance $X_2$ (i.e., along a second optical path, some of which is unique and some of which overlaps with at least the first optical path) to reach scan mirror 360a, blue laser light from blue laser diode 313a travels a third distance $X_3$ (i.e., along a third optical path, some of which is unique, some of which overlaps with at least the second optical path, and some of which overlaps with at least the second optical path and the first optical path) to reach scan mirror 360a, and infrared laser light from infrared laser diode 314a travels a fourth distance $X_4$ (i.e., along a fourth optical path, some of which is unique, some of which overlaps with at least the third optical path, some of which overlaps with at least the third optical path and the second optical path, and some of which overlaps with the third optical path, the second optical path, and the first optical path) to reach scan mirror 360a. The first distance $X_1$ travelled by the red laser light is shorter than the second distance $X_2$ travelled by the green laser light, which is shorter than the third distance $X_3$ travelled by the blue laser light, which is shorter than the fourth distance $X_4$ travelled by the fourth laser light. That is, $X_1 < X_2 < X_3 < X_4$.

The laser light emitted by each of laser diodes 311a, 312a, 313a, and 314a travels a different distance but with substantially the same rate of convergence and substantially the same spot size at all shared points along the optical paths thereof. The implementation of laser projector 300a achieves this by allowing the laser light from each of laser diodes 311a, 312a, 313a, and 314a to diverge to a different respective spot size before impinging on a corresponding focusing lens 321a, 322a, 323a, and 324a, respectively, such that the laser light from each of laser diodes 311a, 312a, 313a, and 314a begins to converge from a spot size that depends on the length of the optical path from the laser diode 311a, 312a, 313a, and 314a to the scan mirror 360a. Specifically, focusing lens 321a is positioned relative to the output of red laser diode 311a so that red laser light impinges thereon with a first spot size $S_1$, focusing lens 322a is positioned relative to the output of green laser diode 312a so that green laser light impinges thereon with a second spot size $S_2$, focusing lens 323a is positioned relative to the output of blue laser diode 313a so that blue laser light impinges thereon with a third spot size $S_3$, and focusing lens 324a is positioned relative to the output of infrared laser diode 314a so that infrared laser light impinges thereon with a fourth spot size $S_4$. Since the rate of convergence applied by each of focusing lenses 321a, 322a, 323a, and 324a is substantially the same and all of the rays or beams of laser light advantageously have substantially the same spot size 350a at scan mirror 360a, the spot size of each laser light at its focusing lens increases with distance from scan mirror 360a. That is, since $X_4 > X_3 > X_2 > X_1$, focusing lenses 321a, 322a, 323a, and 324a are respectively positioned relative to laser diodes 311a, 312a, 313a, and 314a so that $S_4 > S_3 > S_2 > S_1$. And since $S_4 > S_3 > S_2 > S_1$, the sizes (e.g., diameters) of focusing lenses 321a, 322a, 323a, and 324a themselves are non-uniform in projector 300a. Specifically, focusing lens 321a has a first diameter $D_1$ designed to receive diverging red laser light having first spot size $S_1$ from red laser diode 311a, focusing lens 322a has a second diameter $D_2$ designed to receive diverging green laser light having second spot size $S_2$ from green laser diode 312a, focusing lens 323a has a third diameter $D_3$ designed to receive diverging blue laser light having third spot size $S_3$ from blue laser diode 313a, and focusing lens 324a has a fourth diameter $D_4$ designed to receive diverging infrared laser light having fourth spot size $S_4$ from infrared laser diode 314a. Since $S_4 > S_3 > S_2 > S_1$, the diameters of focusing lenses 321a, 322a, 323a, and 324a are selected so that $D_4 > D_3 > D_2 > D_1$. Furthermore, the sizes of reflectors 331a, 332a, 333a, and 334a are non-uniform in projector 300a, with reflector 334a being larger than reflector 33a, which is larger than reflector 332a, which is larger than reflector 331a. The size of each reflector 331, 332a, 333a, and 334a is designed to accommodate the spot size of the particular laser light that the reflector is operative to reflect.

In summation, by implementing the conventional approach of having a dedicated focusing lens 321a, 322a, 323a, and 324a for each respective laser diode 311a, 312a, 313a, and 314a within the elongated form factor of projector 300a: A) the spacing between each laser diode and its corresponding focusing lens increases as the distance between the focusing lens and scan mirror 360a increases in order to allow the laser light emitted by the laser diode to diverge to a sufficient spot size so the rate of convergence commonly applied by all of focusing lenses 321a, 322a, 323a, and 324a results in all of the rays or beams of laser light having the same spot size 350a at scan mirror 360a (with the spacing between focusing lens 321a and laser diode 311a being the smallest spacing because $X_1$ is the shortest distance and the spacing between focusing lens 324a and laser diode 314a being the largest spacing because $X_4$ is the largest distance), B) the diameter (and overall size) of each focusing lens 321a, 322a, 323a, and 324a increases as the distance between the focusing lens and scan mirror 360a increases in order to receive the full spot size of the corresponding laser light, and C) the size of each reflector 331a, 332a, 333a, and 334a increases as the distance between the reflector and scan mirror 360a increases in order to receive the full spot size of the corresponding laser light. All of these factors (i.e., A, B, and C) combine to cause the overall footprint of the components in the longest optical path (i.e., the footprint of infrared laser diode 314a, focusing lens 324a, and reflector 334a in the optical path of the infrared laser light emitted by infrared laser diode 314a) to be considerably larger than the footprint of the components in the optical path of the shortest optical path (i.e., the footprint of red laser diode 311a, focusing lens 321a, and reflector 331a in the optical path of the red laser light emitted by red laser diode 311a). Thus, while laser projector 300a does embody an elongated form factor and such is desirable for certain applications, such as in region 220 of WHUD 200, the use of the conventional approach of having a respective focusing lens 321a, 322a, 323a, and 324a for each laser diode 311a, 312a, 313a, and 314a adds unwanted size to laser projector 300a (e.g., due to the larger spacings and optical components 324a, 334a in the relatively long optical path of infrared laser light relative to the more compact spacings and optical components 321a, 331a in the relatively shorter optical path of red laser light) and prevents laser projector 300a from reaching a sufficiently compact form factor to fit in region 220 of WHUD 200.

In accordance with the present systems, devices, and methods, a laser projector having an elongated geometry may achieve a more compact form factor by using a single, dedicated convergence lens to focus the laser light emitted by all laser diodes instead of the conventional approach of having a separate respective focusing lens for each respective laser diode.

FIG. 3B is an illustrative diagram of an exemplary laser projector 300b that adopts an elongated form factor and employs a single dedicated convergence lens 340b to focus the laser light in accordance with the present systems, devices, and methods. Laser projector 300b is conceptually and operationally similar to laser projector 300a from FIG. 3A in that laser projector 300b also includes four laser diodes 311b, 312b, 313b, and 314b (e.g., a red laser diode 311b, a green laser diode 312b, a blue laser diode 313b, and an infrared laser diode 314b) and each laser diode is operative to provide diverging laser light (i.e., laser light having a divergence). However, the lenses and reflectors in the optical paths of the rays or beams of laser light emitted by laser diodes 311b, 312b, 313b, and 314b of laser projector 300b are arranged differently, in accordance with present systems, devices, and methods, relative to the lenses and reflectors in the optical paths of the laser light emitted by laser diodes 311a, 312a, 313a, and 314a of laser projector 300a in order to provide laser projector 300b with a more compact form factor than that of laser projector 300a. In a similar way to the illustration of laser projector 300a in FIG. 3A, in the illustration of laser projector 300b in FIG. 3B laser light is represented by pairs of solid arrows, where the area including and in between each pair of solid arrows corresponds to a respective laser beam.

Laser projector 300b includes a laser module 310b to provide laser light, where laser module 310b includes at least a first laser diode 311b to provide a first laser light such that the laser light provided by the laser module includes at least the first laser light. As previously described, first laser diode 311b may be a red laser diode, though in practice first laser diode 311b may be any variety of laser diode operative to produce laser light having any wavelength (e.g., green, blue, infrared, ultraviolet, or somewhere in between) depending on the specific implementation.

The first laser light provided by first laser diode 311b may generally exhibit, be imbued with, or "have" a divergence (at least at a certain distance from the first laser diode) that causes the spot size of the first laser light to expand as distance from first laser diode 311b increases. In order to keep this expansion in check so that all of the first laser light remains in the projection path without unduly large optical components, laser module 310b also includes a first collimation lens 321b positioned in the optical path of the first laser light. First collimation lens 321b receives the first laser light from first laser diode 311b and at least reduces a divergence of the first laser light. In some implementations, first collimation lens 321b may substantially collimate the first laser light; however, in other implementations the first laser light coming out of first collimation lens 321b may still have some divergence (though less divergence than the first laser light going into first collimation lens 321b) or the first laser light coming out of first collimation lens 321b may have some convergence. Throughout this specification and the appended claims, the term "collimation" is used loosely in "collimation lens" to refer to a lens that at least reduces the divergence of light passing therethrough and may or may not cause the light to actually be collimated. As used herein, "substantially collimate" generally means to collimate within +/−10%.

With respect to its position in the optical path of the first (e.g., red) laser light, first collimation lens 321b in projector 300b is analogous to focusing lens 321a in projector 300a. Focusing lens 321a in projector 300a receives diverging red laser light from red laser diode 311a and converges or focuses that red laser light, whereas first collimation lens 321b in projector 300b receives diverging first laser light from first laser diode 311b and reduces the divergence of that first laser light. Focusing lens 321a in projector 300a focuses the red laser light by initiating the rate of convergence that propagates right through and out of the aperture of projector 300a, whereas first collimation lens 321b in projector 300b reduces the divergence of the first laser light (e.g., substantially collimates the first laser light) so that the first laser light propagates through projector 300b with a relatively compact spot size, but first collimation lens 321b does not focus the first laser light or initiate the rate of convergence that will propagate out through the aperture of projector 300b. In order to focus/converge the first laser light, the optical path of the first laser light in projector 300b includes a second lens (as distinct from the optical path of the red laser light in projector 300a), namely, convergence lens 340b.

Convergence lens 340b is positioned downstream from laser module 310b in an optical path of the laser light provided by laser module 310b. Since the laser light provided by laser module 310b includes the first laser light provided by first laser diode 311b, convergence lens 340b is positioned in the optical path of the first laser light downstream from first collimation lens 321b. Convergence lens 340b receives the laser light from laser module 310b (including the first laser light from first laser diode 311b) and converges the laser light to a focus 370b that may be outside of projector 300b.

In the illustrated example of projector 300b in FIG. 3B, laser module 310b further includes: a second laser diode 312b (e.g., a green laser diode) to provide a second laser light with a second collimation lens 322b positioned in the optical path of the second laser light to at least reduce the divergence of the second laser light; a third laser diode 313b (e.g., a blue laser diode) to provide a third laser light with a third collimation lens 323b positioned in the optical path of the third laser light to at least reduce the divergence of the third laser light; and a fourth laser diode 314b (e.g., an infrared laser diode) to provide a fourth laser light with a fourth collimation lens 324b positioned in the optical path of the fourth laser light to at least reduce the divergence of the fourth laser light. The second laser light, the third laser light, and the fourth laser light are all included (along with the first laser light) in the laser light output by laser module 310b.

In accordance with the present systems, devices, and methods, because collimation lenses 321a, 322b, 323b, and 324b only reduce the divergence of the laser light provided by laser diodes 311b, 312b, 313b, and 314b rather than actually focusing and initiating the "output" rate of convergence (output by the projector as a whole) of the laser light (as is done by analogous focusing lenses 321a, 322a, 323a, and 324a in projector 300a), collimation lenses 321b, 322b, 323b, and 324b do not each need to accommodate a different spot size of laser light from the corresponding laser diode 311b, 312b, 313b, and 314b and, accordingly, collimation lenses 321b, 322b, 323b, 324b may each be substantially the same size as one another. For example, collimation lenses 321b, 322b, 323b, and 324b in projector 300b are all substantially the same size as focusing lens 321a in projector 300a, but because focusing lens 322a is bigger than focusing lens 321a in projector 300a, collimation lenses 321b, 322b, 323b, and 324b in projector 300b are all smaller than focusing lens 322a. Likewise, in projector 300a focusing lens 323a is bigger than focusing lens 322a and focusing lens 324a is bigger than focusing lens 323a, so in projector 300b collimation lenses 321b, 322b, 323b, and 324b are all considerably smaller than focusing lens 323a and focusing lens 324a from projector 300a. The uniform, compact size of collimation lenses 321b, 322b, 323b, and 324b in projector 300b compared to the increasing sizes across focusing lenses 321a, 322a, 323a, and 324a in projector 300a is a contributing factor in realizing the compact form factor of projector 300b compared to the form factor of projector 300a. Furthermore, because each of collimation lenses 321b, 322b, 323b, and 324b is substantially the same size, each of collimation lenses 321b, 322b, 323b, and 324b is positioned to receive substantially the same spot size of laser light from the corresponding laser diode 311b, 312b, 313b, and 314b and, accordingly, collimation lenses 321b, 322b, 323b, and 324b are generally positioned closer to the outputs of laser diodes 311b, 312b, 313b, and 314b, on average, in projector 300b compared to the positions of focusing lenses 321a, 322a, 323a, and 324a relative to laser diodes 311a, 312a, 313a, and 314a in projector 300a. Such positioning also contributes to the relatively compact form factor of projector 300b.

Similar to projector 300a, projector 300b also includes a combiner 330b comprising four reflectors 331b, 332b, 333b, and 334b. In substantially the same way as in projector 300a, the four reflectors 331b, 332b, 333b, and 334b in combiner 330b of projector 300b are positioned and oriented to combine the respective laser light from laser diodes 311b, 312b, 313b, and 314b into a single aggregate laser beam (i.e., the "laser light" output by projector 300b); however, because the laser lights impingent on reflectors 331b, 332b, 333b, and 334b in projector 300b are not converging as they are on reflectors 331a, 332a, 333a, and 334a in projector 300a, reflectors 331b, 332b, 333b, and 334b are all substantially the same size as one another. For example, reflectors 331b, 332b, 333b, and 334b in projector 300b are all substantially the same size as reflector 331a in projector 300a, but because reflector 332a is bigger than reflector 331a in projector 300a, reflectors 331b, 332b, 333b, and 334b in projector 300b are all smaller than reflector 332a. Likewise, in projector 300a reflector 333a is bigger than reflector 332a and reflector 334a is bigger than reflector 333a, so in projector 300b reflectors 331b, 332b, 333b, and 334b are all considerably smaller than reflector 333a and reflector 334a from projector 300a. The uniform, compact size of reflectors 331b, 332b 333b, and 334b in projector 300b compared to the increasing sizes across reflector 331a, 332a, 333a, and 334a in projector 300a is another contributing factor in realizing the compact form factor of projector 300b compared to the form factor of projector 300a.

Reflectors 331b, 332b, 333b, and 334b may include reflective and/or dichroic material to selectively reflect and/ or transmit the various wavelengths of laser light provided by laser diodes 311b, 312b, 313b, and 314b in substantially the same way as that described for reflectors 331a, 332a, 333a, and 334a.

Similar to projector 300a from FIG. 3A, projector 300b includes at least a first scan mirror 360b positioned in the optical path of the laser light (i.e., the aggregate laser light) at the output of combiner 330b. First scan mirror 360b includes a two dimensional reflective area (e.g., a square or rectangular surface having a length and a width or a circular surface having a diameter) and the spot size 350b of the laser light at first scan mirror 360b is less than or about equal to the reflective area of first scan mirror 360b. In some implementations, the reflective area of first scan mirror 360b may be controllably rotatable about a first axis and a dimension of the spot size 350b (e.g., a dimension of the spot) of the laser light at the reflective area of first scan mirror 360b may be less than or about equal to a dimension of the reflective area of first scan mirror 360b along the first axis. Such implementations may further include a second scan mirror (not illustrated in FIG. 3B for the sake of simplicity) positioned in the optical path of the laser light in between first scan mirror 360b and the focus 370b of the laser light. The second scan mirror may include a two dimensional reflective area, where the reflective area of the second scan mirror is controllably rotatable about a second axis that is orthogonal to the first axis of the reflective area of first scan mirror 360b. In this configuration, the spot size (e.g., a dimension of the spot size or a dimension of the spot) of the laser light at the reflective area of the second scan mirror may be less than or about equal to a dimension of the reflective area of the second scan mirror along the second axis.

In the illustrated example of projector 300b, diverging laser light provided by laser diodes 311b, 312b, 313b, and 314b is substantially collimated by collimation lenses 321b, 322b, 323b, and 324b, respectively, and remains collimated when reflected and combined into a single aggregate laser beam by reflectors 331b, 332b, 333b, and 334b of combiner 330b. In accordance with the present systems, devices, and methods, this approach allows for more compact optical components with more compact spacing therebetween compared to the analogous components in projector 300a from FIG. 3A, contributing to a more compact overall form factor in projector 300b relative to the form factor of projector 300a. In order to focus the laser light (i.e., the aggregate laser light) down to a spot size 350b that is less than or equal to the size of the at least one scan mirror 360b at the position of the mirror 360b, projector 300b includes a dedicated convergence lens 340b in the optical path of the aggregate laser light in between combiner 330b and the at least one scan mirror 360b. Since the laser light from each of laser diodes 311b, 312b, 313b, and 314b are all substantially collimated and with substantially the same spot size when incident on convergence lens 340b, single convergence lens 340b applies substantially the same rate of convergence to each ray or beam of the laser light from respective ones of laser diodes 311b, 312b, 313b, and 314b such that each ray or beam of the laser light maintains substantially the same spot size as the other rays or beams of laser light at all points along the optical paths thereof as they converge to focus 370b and diverge therefrom.

Focus 370b is a common focal point of each ray or beam of the laser light emitted by respective laser diodes 311b, 312b, 313b, and 314b. In other words, focus 370b is a focal point of the aggregate laser light output by projector 300b, the position of which is determined by the rate of convergence applied to the aggregate laser light by convergence lens 340b. Generally, in laser projection applications it is advantageous for the position of focus 370b to be outside of the projector as illustrated in FIG. 3B. Furthermore, as the laser light emitted by laser diodes 311b, 312b, 313b, and 314b may generally be Gaussian beams, the spot size at focus 370b may not reach zero but may rather converge to a non-zero beam waist. That is, the laser light may converge to a focus having a diameter that is greater than zero, such as a diameter on the order of micrometers or millimeters. The non-zero beam waist of the aggregate laser light at focus 370b may correspond to the minimum spot size of the aggregate laser light along the optical path thereof; thus, spot size 350b of the laser light at scan mirror 360b is larger than the spot size (e.g., minimum beam waist) of the laser light at focus 370b.

In various alternative implementations, a laser projector employing a single dedicated convergence lens to focus the laser light from multiple laser diodes may include any number N of laser diodes (i.e., where N≥1) arranged in any configuration and having any combination of wavelengths. Because the laser projectors described herein that employ a single convergence lens also may include a set of collimation lenses (i.e., to at least reduce the divergence of laser light output by the laser diodes), and the collimation lenses are upstream from the convergence lens in the optical paths of the laser light, the collimation lenses may generally be referred to herein as "primary lenses" and the convergence lens may generally be referred to herein as a "secondary lens."

Figure 4:
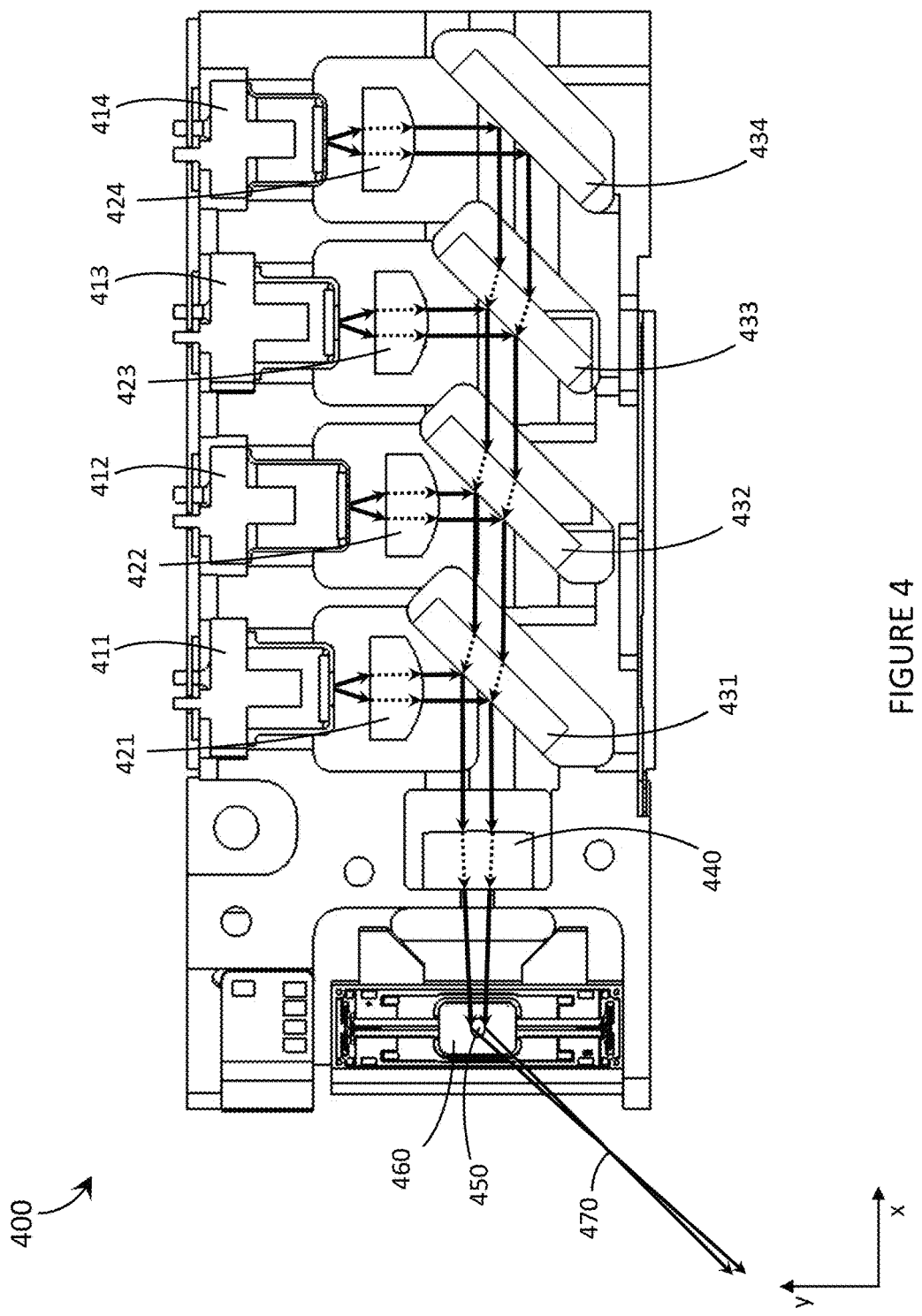
FIG. 4 is a more detailed illustrative diagram (relative to FIG. 3B) of an exemplary laser projector that employs the present systems, devices, and methods for focusing laser light.

FIG. 4 is a more detailed illustrative diagram (relative to FIG. 3B) of an exemplary laser projector 400 that employs the present systems, devices, and methods for focusing laser light. Projector 400 is substantially similar to projector 300b from FIG. 3B but shows a few more specific details not illustrated in FIG. 3B. Projector 400 includes N laser diodes 411, 412, 413, and 414 where N=4, and each of laser diodes 411, 412, 413, and 414 provides a respective laser light having a divergence (e.g., a respective diverging laser light) represented by a respective pair of diverging solid arrows. Each primary lens in set of N=4 primary lenses 421, 422, 423, and 424 is positioned and oriented to receive a respective laser light from a respective one of the N=4 laser diodes 411, 412, 413, and 414. The diverging laser light from each respective one of laser diodes 411, 412, 413, and 414 impinges on and is transmitted through a respective one of the N=4 primary lenses 421, 422, 423, and 424. Representative optical paths of each laser light through each primary lens 421, 422, 423, and 424 is represented by a respective pair of dashed arrows in FIG. 4. As illustrated in the Figure, each respective one of the N=4 primary lenses 421, 422, 423, and 424 at least reduces the divergence of a respective laser light from a respective one of the N=4 laser diodes 411, 412, 413, and 414. The laser light emitted by each one of the N=4 primary lenses 421, 422, 423, and 424 is represented by a respective pair of solid and substantially parallel arrows in FIG. 4, indicating that the laser light emitted by each one of the N=4 primary lenses 421, 422, 423, and 424 is substantially collimated. However, in alternative implementations one or more of the N=4 primary lenses 421, 422, 423, 423, 424 may emit laser light that has a small degree of convergence or divergence, provided that the primary lens at least reduces the divergence of the laser light relative to the divergence of the laser light that the primary lens receives from the corresponding one of the N=4 laser diodes 411, 412, 413, and 414. In this way, primary lenses 411, 412, 413, and 414 of projector 400 are substantially similar to collimation lenses 321b, 322b, 323b, and 324b of projector 300b from FIG. 3B.

In projector 300b from FIG. 3B, each of laser diodes 311b, 312b, 313b and 314b is substantially the same size and each collimation lens 321b, 322b, 323b, and 324b is positioned at substantially the same position in the y-direction. Each collimation lens 321b, 322b, 323b, and 324b in projector 300b is also positioned substantially the same distance from a corresponding laser diode 311b, 312b, 313b, and 314b. In contrast, in projector 400 the N=4 laser diodes 411, 412, 413, and 414 are various sizes and the corresponding N=4 primary lenses 421, 422, 423, and 424 are positioned in various different positions in the y-direction in order to accommodate both: a) the size of the corresponding laser diode 411, 412, 413, and 414 with which the primary lens 421, 422, 423, and 424 is paired, and b) the specific divergence of the laser light emitted by the corresponding laser diode 411, 412, 413, and 414 with which the primary lens 421, 422, 423, and 424 is paired. Since different ones of the N=4 laser diodes 411, 412, 413, and 414 may provide laser light having a different degree of divergence, the optical power and/or y-position of each primary lens 421, 422, 423, and 424 may be different from one primary lens to the next in order to provide all of the rays or beams of laser light with substantially the same spot size and, in the illustrated implementation of FIG. 4, substantially the same collimation.

The rays or beams of laser light having at least reduced divergence (e.g., collimated laser light) output by the N=4 primary lenses are received by a combiner comprising N=4

(e.g., dichroic) reflectors 431, 432, 433, 434, which combine the respective laser light generated by respective ones of the N=4 laser diodes 411, 412, 413, and 414 into at least one aggregate laser light (e.g., into a single aggregate laser light). The N=4 reflectors 421, 422, 423, and 424 in projector 400 are substantially similar to (e.g., at least reflectors 431, 432, and 433 may include dichroic material), and arranged in a configuration that is substantially similar to that described for, reflectors 331a, 332a, 333a, and 334a in projector 300a of FIG. 3A and reflectors 331b, 332b, 333b, and 334b of combiner 330b in projector 300b of FIG. 3B, with the exception that in projector 400, the N=4 reflectors 431, 432, 433, and 434 are staggered/offset from one another with respect to the optical paths of the laser light in order to account for refraction of the laser light passing through each dichroic reflector (e.g., at least 431, 432, and 433) and ensure that all of the rays or beams of laser light align into a single aggregate laser beam. Refraction of laser light through each of reflectors 431, 432, and 433 is represented by pairs of dashed arrows in FIG. 4. In some implementations, this staggered/offset configuration may be eliminated, and the overall size of projector 400 may be further reduced, by employing a monolithic combiner as described in U.S. Provisional Patent Application Ser. No. 62/438,725, which is particularly well-suited for use in combination with the primary and secondary lenses described herein because, as preciously described, such enable the reflectors 431, 432, 433, and 434 of the combiner to all be substantially the same size as one another as is the case within a monolithic combiner.

The aggregate laser light leaving the combiner in projector 400 (i.e., the aggregate laser beam travelling away from reflector 431 represented by a pair of solid arrows) is substantially collimated. This is in contrast to the converging aggregate beam travelling away from reflector 331a in projector 300a from FIG. 3A. As previously described, the collimation of the aggregate laser beam in projector 400 allows for smaller, more compact optical components to be arranged in a more compact configuration in projector 400 compared to projector 300a, contributing to a smaller, more compact overall form factor for projector 400 compared to the form factor of projector 300a. However, the aggregate laser light in projector 400 still needs to be focused and converged down to a spot size 450 that will fit on the at least one scan mirror 460. To this end, and in accordance with the present systems, devices, and methods, projector 400 includes a secondary lens 440 (i.e., analogous to the convergence lens of projector 300b) positioned and oriented to receive the aggregate laser light from the combiner (e.g., from reflector 431) and converge the aggregate laser light to a focus 470 outside of laser projector 400. At focus 470 the aggregate laser light may have a non-zero beam waist as previously described.

Scan mirror 460 is positioned and oriented to receive the aggregate laser light (e.g., converging aggregate laser light) from secondary lens 440. Scan mirror 460 includes a two dimensional reflective area and the spot size 450 of the aggregate laser light at scan mirror 460 is less than or about equal to the reflective area; however, since the aggregate laser light is converging when it is incident upon scan mirror 460, the spot size 450 of the aggregate laser light at scan mirror 460 is greater than a spot size of the aggregate laser light at focus 470. As previously described, scan mirror 460 may be controllably variable (e.g., rotatable or deformable) about two orthogonal axes or scan mirror 460 may be a first scan mirror that is controllably variable about a first axis and projector 400 may further include a second scan mirror (not shown in FIG. 4) that is controllably variable about a second axis that is orthogonal to the first axis.

Projector 400 is an example of a laser projector that implements the present systems, devices, and methods for focusing laser projectors. Laser projector 400 includes N=4 laser diodes 411, 412, 413, and 414 and N=4 primary lenses 421, 422, 423, and 424, though in alternative implementations any number N greater than or equal to 1 of laser diodes and corresponding primary lenses may be used. Generally, when N≥2, a first laser diode may provide laser light of a first wavelength and a second laser diode may provide laser light of a second wavelength.

In addition to realizing a more compact form factor, in particular a more compact elongated form factor that is well-suited for use in a wearable heads-up display having the general size and appearance of a pair of eyeglasses, the present systems, devices, and methods for focusing laser projectors may offer certain optical advantages as well. For example, for a given spot size at the at least one scan mirror, the use of a secondary "convergence" lens enables the convergence of the laser beam(s) to begin much closer to the at least one scan mirror than if only the primary lens(es) is/are used to focus the beam(s). In order to achieve the same spot size (e.g., about the size of the at least one scan mirror) over a shorter distance, the use of a secondary "convergence" lens enables a faster/steeper rate of convergence of the laser beam(s) compared to implementations in which the primary lens(es) is/are used to focus the beam(s). Since the at least one scan mirror serves as an aperture in the laser projector, this faster/steeper rate of convergence effectively gives the laser projector a larger numerical aperture, brings the focus of the laser projector closer to the output of the laser projector, and generally enables a smaller, tighter, sharper spot to be formed at the beam waist (e.g., at the focus) of the aggregate laser beam. All of these factors can improve the quality of image projection in certain applications.

The divergence/convergence angle of a Gaussian beam is generally inversely related to the beam waist, as described in the simplified relation of equation 1 below:

$$\theta \cong \frac{\lambda}{\pi \omega_0} \quad (1)$$

Where $\theta$ is the divergence/convergence angle (i.e., convergence angle for light approaching the beam waist and divergence angle for light travelling away from the beam waist), $\lambda$ is the wavelength of the laser light, and $\omega_o$ is the beam waist (equation from Svelto, Orazio (2010), *Principles of Lasers* (5th ed.), pp. 153-155). Based on equation 1, the larger convergence angle $\theta$ enabled by the proximity of the secondary lens to the at least one scan mirror, as compared to the distance between the at least one scan mirror and the furthest primary lens (e.g., lens 324a in projector 300a) in the laser projector, results in a smaller beam waist $\omega_o$ at the focus of the laser beam. A smaller beam waist $\omega_o$ generally enables a tighter, cleaner laser spot to be formed and can improve image quality in laser projection.

As described above, one advantage (for certain applications) of the use of a secondary convergence lens as described herein is that such can be used to bring the focus of the laser beam closer to the output of the laser projector. Such can be advantageous in wearable heads-up displays employing virtual retinal projection, such as WHUD 100 from FIG. 1 and WHUD 200 from FIGS. 2A and 2B, because the steep rate of convergence that brings the focus of the laser beam closer to the output of the laser projector also produces a steeper rate of convergence that increases the spot size of the laser beam on the holographic combiner of the WHUD.

Figure 5:
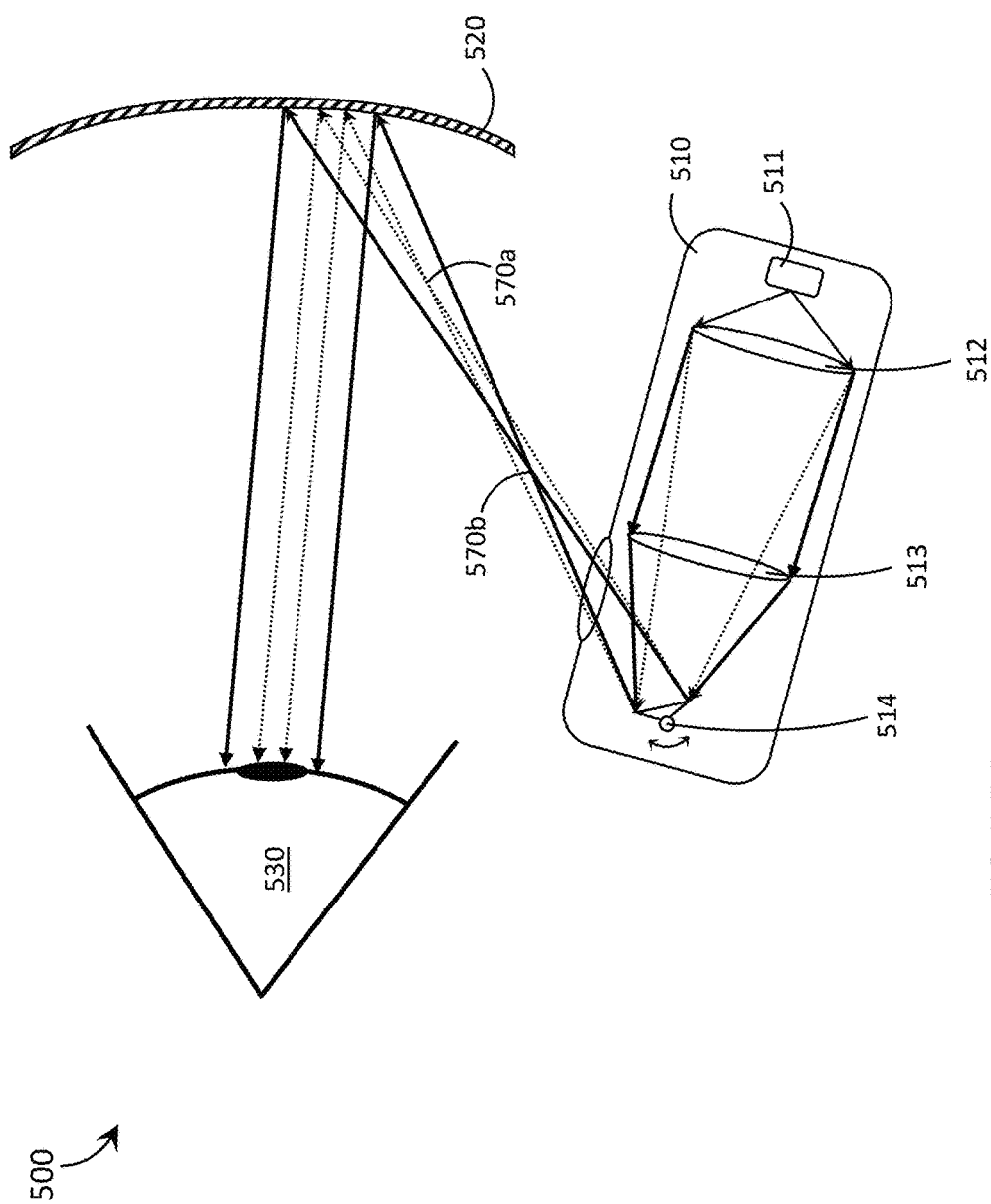
FIG. 5 is an illustrative diagram of a simplified wearable heads-up display showing a comparison between: i) the conventional approach of focusing the laser light produced by a laser projector using only primary lenses at the laser diodes, and ii) focusing the same laser light using a secondary lens positioned nearer to the output of the laser projector in accordance with the present systems, devices, and methods.

FIG. 5 is an illustrative diagram of a simplified WHUD 500 showing a comparison between: i) the conventional approach of focusing the laser light produced by a laser projector using only primary lenses at the laser diodes, and ii) focusing the same laser light using a secondary lens positioned nearer to the output of the laser projector in accordance with the present systems, devices, and methods. WHUD 500 may be substantially similar to WHUD 100 from FIG. 1 in that WHUD 500 includes laser projector 510 and holographic combiner 520, though a support structure of WHUD 500 is not shown in FIG. 5 to reduce clutter. Laser projector 510 includes a first laser diode 511 (only one shown for illustrative purposes but in practice any number of laser diodes may be included) and at least one scan mirror 514. The optical path between laser diode 511 and scan mirror 514 includes a primary lens 512 and a secondary lens 513. Laser diode 511 provides diverging laser light (i.e., laser light having a divergence) that impinges on primary lens 512. FIG. 5 illustrates two scenarios for the sake of comparison: i) a first scenario analogous to projector 300a from FIG. 3A in which primary lens 512 serves as a "focusing lens" (e.g., 321a, 322a, 323a, or 324a) and converges the laser light (illustrated by a pair of dashed arrows in FIG. 5 converging from primary lens 512 to scan mirror 514) provided by laser diode 511 to have a spot size at scan mirror 514 that completely fits on (e.g., fills) the reflective area of scan mirror 514, and ii) a second scenario analogous to projector 300b from FIG. 3B in which primary lens 512 serves as a "collimation lens" (321b, 322b, 323b, or 324b) and substantially collimates the laser light (illustrated by a pair of solid arrows in FIG. 5 in parallel between primary lens 512 and secondary lens 513) and secondary lens 513 converges the laser light (illustrated by a pair of solid arrows in FIG. 5 converging from secondary lens 513 to scan mirror 514) to have a spot size at scan mirror 514 that completely fits on the reflective area of scan mirror 514. In the first scenario, the converging laser light travelling between primary lens 512 and scan mirror 514 "passes through" secondary lens 513 unaffected (i.e., as if secondary lens 513 were not there).

In both the first scenario and the second scenario, the spot size of the laser light at scan mirror 514 is substantially the same. However, in the first scenario the laser light begins to converge from a point (i.e., primary lens 512) that is relatively far away from scan mirror 514 whereas in the second scenario the laser light begins to converge from a point (i.e., secondary lens 513) that is relatively close to scan mirror 514. This means that the rate of convergence for the laser light in the second scenario (i.e., converging from secondary lens 513) is greater than the rate of convergence of the laser light in the first scenario (i.e., converging from primary lens 512). As previously described (e.g., in reference to equation 1), the higher rate of convergence enabled by the proximity of secondary lens 513 to scan mirror 514 enables the laser light to focus to a tighter, cleaner spot and effectively gives laser projector 510 a higher numerical aperture compared to the first scenario in which primary lens 512 is used to focus the laser beam.

Laser light that is focused by primary lens 512 (i.e., the laser light drawn with dashed arrows in FIG. 5 corresponding to the first scenario described above) is converged to a focus 570a at a first position in between projector 510 and holographic combiner 520. Laser light that is focused by secondary lens 513 (i.e., the laser light drawn with solid arrows in FIG. 5 corresponding to the second scenario described above) is converged to a focus 570b at a second position in between projector 510 and holographic combiner 520. Due to the higher rate of convergence applied to the laser light focused by secondary lens 513 (solid arrows) compared to the rate of convergence applied to the laser light focused by primary lens 512 (dashed arrows), focus 570b is closer to projector 510 and further from holographic combiner 520 compared to focus 570a. A result of this displacement of the focus is that the spot size of the laser light that (solid arrows) has been focused by secondary lens 513 is larger at holographic combiner 520 than the spot size of the laser light (dashed arrows) that has been focused by primary lens 512 (and in either case, the spot size of the laser light at holographic combiner 520 is larger than the spot size of the laser light at the focus 570a, 570b). This larger spot size is illustrated in FIG. 5 by the larger spacing between the pair of solid arrows at holographic combiner 520 compared to the spacing between the pair of dashed arrows at holographic combiner 520.

In WHUD 500, holographic combiner 520 includes at least one hologram that is operative to at least approximately collimate the laser light impingent thereon from projector 510 and redirect the at least approximately collimated laser light towards the eye 530 of the user. This being the case, it can be advantageous for the laser light to impinge on holographic combiner 520 with a relatively larger spot size because a larger spot size at holographic combiner 520 corresponds to a larger spot size at eye 530. Having a larger spot size of the laser light at eye 530 can be advantageous because such can render the laser light visible from a wider range of pupil positions and/or because such can result (according to equation 1) in a smaller, tighter spot being formed on the retina of eye 530 by the lens within eye 530. Thus, using a secondary lens 513 instead of the conventional primary lens 512 to focus the laser light in a laser projector 510 can be particularly advantageous in applications involving virtual retinal displays such as WHUD 500.

Figure 6:
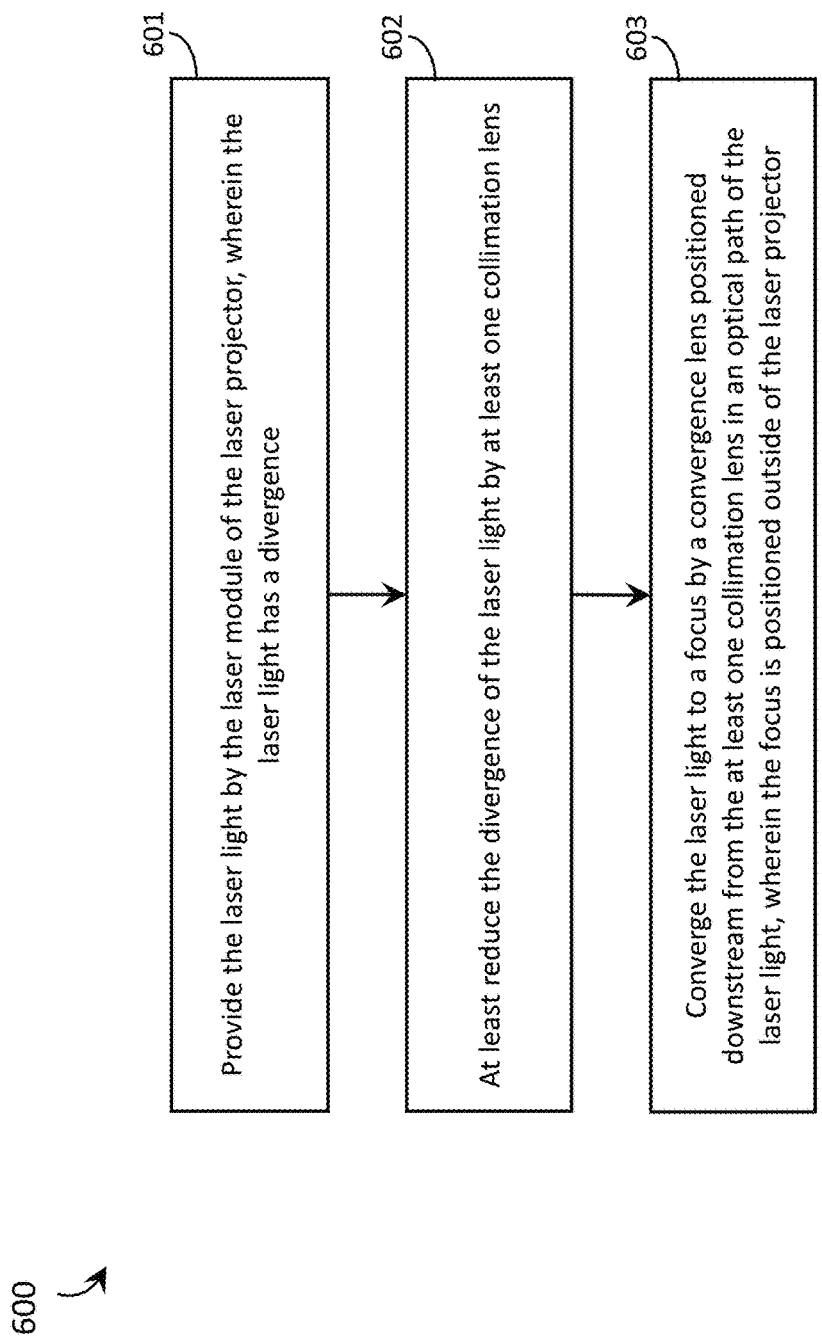
FIG. 6 is a flow-diagram showing a method of focusing a laser light provided by a laser projector in accordance with the present systems, devices, and methods.

FIG. 6 is a flow-diagram showing a method 600 of focusing a laser light provided by a laser projector in accordance with the present systems, devices, and methods. The projector may be substantially similar to projector 300b or projector 400 (as appropriate based on the descriptions of the specific acts that follow) and generally includes a laser module having a least one laser diode (e.g., N laser diodes, where N≥1), at least one primary or "collimation" lens for each laser diode (e.g., N primary lenses), and a single secondary or "convergence" lens. Method 600 includes three acts 601, 602, and 603 though those of skill in the art will appreciate that in alternative embodiments certain acts may be omitted and/or additional acts may be added. Those of skill in the art will also appreciate that the illustrated order of the acts is shown for exemplary purposes only and may change in alternative embodiments.

At 601, the laser module of the projector provides a laser light that has a divergence. The laser module may include any number N≥1 of laser diodes and at 601 any number of the N laser diodes may provide a respective diverging laser light.

At 602, at least one primary or collimation lens of the projector at least reduces the divergence of the laser light. When the laser projector includes multiple laser diodes (i.e., when N 2), a respective one of N primary or collimation lenses may be paired with each respective one of the N laser diodes and at 602 each respective one of the N primary or collimation lenses may at least reduce the divergence of each respective laser light provided by each respective one of the N laser diodes. In some implementations, at least reducing the divergence of the laser light by the at least one primary or collimation lens may include collimating the laser light by the at least one primary or collimation lens.

At 603, the secondary or convergence lens of the projector converges the laser light to a focus, where the focus is positioned outside of the projector. The convergence or secondary lens may be positioned downstream from the at least one primary or collimation lens in an optical path of the laser light. Generally, the focus to which the laser light is converged by the secondary or convergence lens may have a non-zero beam waist.

In some implementations, a secondary lens as described herein may be adapted to perform/impart more optical functions in addition to the convergence function. For example, a secondary lens (such as secondary lens 340*b*, 440, and/or 513) may include a spherical curvature on a first surface for the purpose of applying the convergence function described herein, and additionally, the secondary lens (such as secondary lens 340*b*, 440, and/or 513) may include a cylindrical curvature on a second surface (the second surface opposite the first surface across a thickness of the secondary lens) for the purpose of correcting or compensating for an astigmatism that would otherwise be present in the projection system. Systems that require astigmatism correction/compensation (including some WHUD architectures, as described in U.S. Provisional Patent Application Ser. No. 62/420,368) may benefit from integrating astigmatism correction/compensation and convergence functions into a single secondary lens (e.g., 340*b*, 440, or 513) rather than employing two discrete optical elements to achieve the convergence and astigmatism correction/compensation functions separately. In a similar way, the secondary lens described herein may be adapted to perform/impart other optical functions in order to help correct other aberrations or unwanted effects present in a projection system.

Throughout this specification and the appended claims, the term "about" is sometimes used in relation to specific values or quantities. For example, a spot size "about equal to" a mirror size in at least one dimension (or vice versa, a mirror size about equal to a spot size in at least one dimension). Unless the specific context requires otherwise, the term about generally means ±15%.

A person of skill in the art will appreciate that the present systems, devices, and methods may be applied or otherwise incorporated into projector architectures that employ one or more light source(s) other than a laser. For example, in some implementations one or more laser(s) in a projector described herein may be replaced by another light source, such as a light source comprising one or more light-emitting diodes ("LEDs"), and/or one or more organic LEDs ("OLEDs"). Such non-laser implementations may advantageously employ additional optics to collimate, focus, and/or otherwise direct projected light signals. Unless the specific context requires otherwise, a person of skill in the art will appreciate that references to a "SLP" throughout the present systems, devices, and methods are generic to other light sources (combined with other optics, as necessary) that may be applied or adapted for application to accomplish the same general function(s) associated with the SLPs described herein.

A person of skill in the art will appreciate that the present systems, devices, and methods may be applied or otherwise incorporated into WHUD architectures that employ one or more transparent combiner(s) other than a holographic combiner. For example, in some implementations the holographic combiner described herein may be replaced by a non-holographic device that accomplishes substantially the same general function(s), such as prismatic film, a film that carries a microlens array, and/or a waveguide structure. Such non-holographic implementations may or may not employ additional optics. Unless the specific context requires otherwise, a person of skill in the art will appreciate that references to a "holographic combiner" throughout the present systems, devices, and methods are generic to other transparent combiners (combined with other optics, as necessary) that may be applied or adapted for application to accomplish the same general function(s) associated with the holographic combiners described herein.

A person of skill in the art will appreciate that the various embodiments for focusing laser projectors described herein may be applied in non-WHUD applications. For example, the present systems, devices, and methods may be applied in non-wearable heads-up displays and/or in other projector applications that may or may not include a visible projected display.

In some implementations, one or more optical fiber(s) may be used to guide light signals along some of the paths illustrated herein.

The WHUDs described herein may include one or more sensor(s) (e.g., microphone, camera, thermometer, compass, altimeter, and/or others) for collecting data from the user's environment. For example, one or more camera(s) may be used to provide feedback to the processor of the WHUD and influence where on the display(s) any given image should be displayed.

The WHUDs described herein may include one or more on-board power sources (e.g., one or more battery(ies)), a wireless transceiver for sending/receiving wireless communications, and/or a tethered connector port for coupling to a computer and/or charging the one or more on-board power source(s).

The WHUDs described herein may receive and respond to commands from the user in one or more of a variety of ways, including without limitation: voice commands through a microphone; touch commands through buttons, switches, or a touch sensitive surface; and/or gesture-based commands through gesture detection systems as described in, for example, U.S. Non-Provisional patent application Ser. No. 14/155,087, U.S. Non-Provisional patent application Ser. No. 14/155,107, PCT Patent Application PCT/US2014/057029, US Patent Application Publication No. US 2015-0370326 A1, U.S. Provisional Patent Application Ser. No. 62/236,060, and/or US Patent Application Publication No. US 2017-0097753 A1, all of which are incorporated by reference herein in their entirety.

Throughout this specification and the appended claims the term "communicative" as in "communicative pathway," "communicative coupling," and in variants such as "communicatively coupled," is generally used to refer to any engineered arrangement for transferring and/or exchanging information. Exemplary communicative pathways include, but are not limited to, electrically conductive pathways (e.g., electrically conductive wires, electrically conductive traces), magnetic pathways (e.g., magnetic media), and/or optical pathways (e.g., optical fiber), and exemplary communicative couplings include, but are not limited to, electrical couplings, magnetic couplings, and/or optical couplings.

Throughout this specification and the appended claims, infinitive verb forms are often used. Examples include, without limitation: "to detect," "to provide," "to transmit," "to communicate," "to process," "to route," and the like.

Unless the specific context requires otherwise, such infinitive verb forms are used in an open, inclusive sense, that is as "to, at least, detect," to, at least, provide," "to, at least, transmit," and so on.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet which are owned by Thalmic Labs Inc., including but not limited to: U.S. Provisional Patent Application Ser. No. 62/322,128, US Patent Application Publication No. US 2015-0378161 A1, U.S. Non-Provisional patent application Ser. No. 15/046,234, U.S. Non-Provisional patent application Ser. No. 15/046,254, U.S. Non-Provisional patent application Ser. No. 15/046,269, U.S. Provisional Patent Application Ser. No. 62/156,736, U.S. Non-Provisional patent application Ser. No. 15/145,576, US Patent Application Publication No. US 2016-0327797 A1, US Patent Application Publication No. US 2016-0327796 A1, U.S. Provisional Patent Application Ser. No. 62/214,600, US Patent Application Publication No. US 2017-0068095 A1, U.S. Provisional Patent Application Ser. No. 62/167,767, U.S. Provisional Patent Application Ser. No. 62/271,135, US Patent Application Publication No. US 2016-0349514 A1, U.S. Provisional Patent Application Ser. No. 62/245,792, U.S. patent application Ser. No. 15/331,204, U.S. Provisional Patent Application Ser. No. 62/438,725, U.S. Non-Provisional patent application Ser. No. 14/155,087, U.S. Non-Provisional patent application Ser. No. 14/155,107, PCT Patent Application PCT/US2014/057029, US Patent Application Publication No. US 2015-0370326 A1, U.S. Provisional Patent Application Ser. No. 62/236,060, US Patent Application Publication No. US 2017-0097753 A1, and U.S. Provisional Patent Application Ser. No. 62/420,368, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A laser projector comprising:
a laser module to provide laser light, the laser module comprising:
a first laser diode to provide a first laser light, wherein the laser light provided by the laser module includes at least the first laser light; and
a first collimation lens positioned in an optical path of the first laser light, the first collimation lens to receive the first laser light and at least reduce a divergence of the first laser light;
a convergence lens positioned downstream from the laser module in an optical path of the laser light, the con- vergence lens to receive the laser light from the laser module and converge the laser light to a focus outside of the projector; and a first scan mirror positioned in the optical path of the laser light in between the convergence lens and the focus of the laser light, wherein a spot size of the laser light at the first scan mirror is greater than a spot size of the laser light at the focus of the laser light, and wherein the first scan mirror includes a two dimensional reflective area and the spot size of the laser light at the first scan mirror is less than or equal to the reflective area of the first scan mirror.

2. The laser projector of claim 1 wherein the reflective area of the first scan mirror is controllably rotatable about a first axis and a dimension of the spot size of the laser light at the reflective area of the first scan mirror is less than or equal to a dimension of the reflective area of the first scan mirror along the first axis.

3. The laser projector of claim 2, further comprising:
a second scan mirror positioned in the optical path of the laser light in between the first scan mirror and the focus of the laser light, wherein:
the second scan mirror includes a two dimensional reflective area;
the reflective area of the second scan mirror is controllably rotatable about a second axis that is orthogonal to the first axis of the reflective area of the first scan mirror; and
a dimension of the spot size of the laser light at the reflective area of the second scan mirror is less than or equal to a dimension of the reflective area of the second scan mirror along the second axis.

4. The laser projector of claim 1 wherein the laser module further comprises:
a second laser diode to provide a second laser light, wherein the laser light provided by the laser module includes the second laser light; and
a second collimation lens positioned in an optical path of the second laser light, the second collimation lens to receive the second laser light and at least reduce a divergence of the second laser light.

5. The laser projector of claim 4 wherein a wavelength of the first laser light is different from a wavelength of the second laser light.

6. The laser projector of claim 4 wherein the laser module further comprises:
at least a third laser diode to provide at least a third laser light, wherein the laser light provided by the laser module includes the at least a third laser light; and
at least a third collimation lens positioned in an optical path of the at least a third laser light, the at least a third collimation lens to receive the at least a third laser light and at least reduce a divergence of the at least a third laser light.

7. The laser projector of claim 4, further comprising:
a combiner positioned and oriented to receive the first laser light and the second laser light and to combine the first laser light and the second laser light into the laser light.

8. The laser projector of claim 7 wherein a wavelength of the first laser light is different from a wavelength of the second laser light, and wherein the combiner comprises:
a first mirror formed of a material that is reflective of the first laser light, the first mirror positioned in the optical path of the first laser light and oriented to redirect the first laser light towards the convergence lens; and a second mirror formed of a dichroic material that is reflective of the first laser light and transmissive of the second laser light, the second mirror positioned in the optical path of the first laser light in between the first mirror and the convergence lens, and the second mirror also positioned in the optical path of the second laser light and oriented to:
redirect the second laser light towards the convergence lens, and
combine the optical path of the second laser light with the optical path of the first laser light for a portion of the optical path of the first laser light that is downstream from the second mirror.

9. A laser projector comprising:
a set of N laser diodes, where N≥1, each laser diode in the set of N laser diodes to provide a respective laser light having a divergence;
a set of N primary lenses, each primary lens in the set of N primary lenses positioned and oriented to receive a respective laser light from a respective one of the N laser diodes and each primary lens in the set of N primary lenses positioned and oriented to at least reduce the divergence of a respective laser light from a respective one of the N laser diodes;
a combiner positioned and oriented to receive each respective laser light having at least reduced divergence from each respective one of the N primary lenses and combine each respective laser light having at least reduced divergence from each respective one of the N primary lenses into an aggregate laser light;
a secondary lens positioned and oriented to receive the aggregate laser light from the combiner and converge the aggregate laser light to a focus outside of the laser projector; and
a first scan mirror positioned and oriented to receive the aggregate laser light from the secondary lens, wherein a spot size of the aggregate laser light at the first scan mirror is greater than a spot size of the aggregate laser light at the focus of the aggregate laser light, and wherein the first scan mirror includes a two dimensional reflective area and the spot size of the aggregate laser light at the first scan mirror is less than or equal to the reflective area of the first scan mirror.

10. The laser projector of claim 9 wherein the reflective area of the first scan mirror is controllably rotatable about a first axis and a dimension of the spot size of the aggregate laser light at the reflective area of the first scan mirror is less than or equal to a dimension of the reflective area of the first scan mirror along the first axis.

11. The laser projector of claim 10, further comprising:
a second scan mirror positioned and oriented to receive the aggregate laser light from the first scan mirror, wherein:
the second scan mirror includes a two dimensional reflective area;
the reflective area of the second scan mirror is controllably rotatable about a second axis that is orthogonal to the first axis of the reflective area of the first scan mirror; and
a dimension of the spot size of the aggregate laser light at the reflective area of the second scan mirror is less than or equal to a dimension of the reflective area of the second scan mirror along the second axis.

12. The laser projector of claim 9 wherein the set of N laser diodes includes a first laser diode to provide laser light of a first wavelength and at least a second laser diode to provide laser light of at least a second wavelength.

\* \* \* \* \*